United States Patent
Hori et al.

(10) Patent No.: US 9,726,734 B2
(45) Date of Patent: Aug. 8, 2017

(54) MAGNETIC RESONANCE IMAGING APPARATUS AND MAGNETIC RESONANCE IMAGING METHOD

(71) Applicant: TOSHIBA MEDICAL SYSTEMS CORPORATION, Otawara-Shi, Tochigi-Ken (JP)

(72) Inventors: Masashi Hori, Nasushiobara (JP); Motohiro Miura, Yaita (JP); Motohisa Yokoi, Nasushiobara (JP); Sho Kawajiri, Nasushiobara (JP)

(73) Assignee: TOSHIBA MEDICAL SYSTEMS CORPORATION, Otawara-Shi, Tochigi-Ken (JP)

( * ) Notice: Subject to any disclaimer, the term of this patent is extended or adjusted under 35 U.S.C. 154(b) by 1150 days.

(21) Appl. No.: 13/863,664

(22) Filed: Apr. 16, 2013

(65) Prior Publication Data
US 2013/0278267 A1    Oct. 24, 2013

(30) Foreign Application Priority Data
Apr. 18, 2012   (JP) ................................. 2012-094899

(51) Int. Cl.
G01V 3/00 (2006.01)
G01R 33/28 (2006.01)
(Continued)

(52) U.S. Cl.
CPC ......... *G01R 33/28* (2013.01); *G01R 33/3852* (2013.01); *G01R 33/546* (2013.01)

(58) Field of Classification Search
CPC .................................................. G01R 33/3852
(Continued)

(56) References Cited

U.S. PATENT DOCUMENTS 5,285,161 A * 2/1994 Rzedzian ........... G01R 33/3852
                                                      324/318
5,311,136 A * 5/1994 Takahashi ......... G01R 33/3852
                                                      324/318
(Continued)

FOREIGN PATENT DOCUMENTS

CN    102958434 A      3/2013
JP    2008-151722      7/2008
(Continued)

OTHER PUBLICATIONS

Office Action dated Dec. 3, 2014 in CN Application No. 201310135377.3.
JP Office Action dated Jan. 31, 2017 in JP 2013-055069.

*Primary Examiner* — Louis Arana
(74) *Attorney, Agent, or Firm* — Nixon & Vanderhye P.C.

(57) ABSTRACT

An MRI apparatus includes a charge/discharge controlling unit, a judging unit and a condition restricting unit. The charge/discharge controlling unit includes a charge/discharge element, receives electric power, and charges the charge/discharge element by using the received electric power. The charge/discharge controlling unit also supplies a gradient magnetic field coil with electric power discharged from the charge/discharge element at a time of performance of magnetic resonance imaging. The judging unit judges whether capacitance of the charge/discharge element falls below a threshold value or not. The condition restricting unit restricts electric power amount supplied to the gradient magnetic field coil by restricting conditions of an imaging sequence, when the capacitance of the charge/discharge element falls below the threshold value.

19 Claims, 10 Drawing Sheets

(51) Int. Cl.
*G01R 33/385* (2006.01)
*G01R 33/54* (2006.01)

(58) Field of Classification Search
USPC .................................. 324/322, 318, 319
See application file for complete search history.

(56) References Cited

U.S. PATENT DOCUMENTS

| | | | |
|---|---|---|---|
| 5,521,507 A * | 5/1996 | Rohan ................ | G01R 33/3852 324/318 |
| 6,154,031 A * | 11/2000 | Hughes .............. | G01R 33/3852 324/318 |
| 2013/0009641 A1 | 1/2013 | Hori et al. | |

FOREIGN PATENT DOCUMENTS

| JP | 2009-240526 | 10/2009 |
|---|---|---|
| JP | 2010-075753 | 4/2010 |
| JP | 2010-150599 | 7/2010 |
| JP | 2011-119998 | 6/2011 |

* cited by examiner

MAGNETIC RESONANCE IMAGING APPARATUS AND MAGNETIC RESONANCE IMAGING METHOD

CROSS-REFERENCE TO RELATED APPLICATIONS

This application is based upon and claims the benefit of priority from Japanese Patent Application No. 2012-94899, filed on Apr. 18, 2012;

The entire contents of which are incorporated herein by reference.

BACKGROUND OF THE INVENTION

1. Field of the Invention

Embodiments described herein relate generally to magnetic resonance imaging.

2. Description of the Related Art

MRI is an imaging method which magnetically excites nuclear spin of an object (a patient) set in a static magnetic field with an RF pulse having the Larmor frequency and reconstructs an image based on MR signals generated due to the excitation. The aforementioned MRI means magnetic resonance imaging, the RF pulse means a radio frequency pulse, and the MR signal means a nuclear magnetic resonance signal.

A gradient magnetic field generation system in an MRI apparatus includes a gradient magnetic field coil which adds spatial positional information to MR signals by applying a gradient magnetic field in an imaging space and a gradient magnetic field power supply which supplies electric power to the gradient magnetic field coil (see, for example, Japanese Patent Application Laid-open (KOKAI) Publication No. 2010-75753).

The gradient magnetic field power supply includes, for example, an electrolytic capacitor which is charged before performance of an imaging sequence and supplies electric power at the time of performance of the imaging sequence.

Capacitance of an electrolytic capacitor governs output specifications of a gradient magnetic field power supply, and influences conditions of an imaging sequence. In general, an electrolytic capacitor used for power source circuits supplying a large amount of power dries up and degrades as long as it is used. The above "dry up" means that desiccation of a separator progresses, because electrolysis solution enclosed inside the electrolytic capacitor evaporates due to heat generation and this makes some parts insufficiently impregnated with the electrolysis solution. If the "dry up" progresses, fibers constituting the separator are peeled off and the capacitance of the electrolytic capacitor becomes smaller.

Therefore, if circuits of a gradient magnetic field power supply and condition setting programs for imaging sequences are designed based on the capacitance value of the electrolytic capacitor of initial installation time, problem-free MRI images can be obtained around the time of the initial installation, whereas there is a possibility that image quality degrades ten years later.

Thus, in conventional technology, circuits of a gradient magnetic field power supply are designed to have margin of, for example, −20% to a nominal capacitance value considering time degradation.

If circuits of a gradient magnetic field power supply are designed so as to have a margin, manufacturing cost of each component increases. Additionally, if the capacitance of an electrolytic capacitor has a sufficient margin by growing the electrolytic capacitor in size and in capacitance based on the theory that capacitance of a capacitor is proportional to surface area of dielectric substance, a gradient magnetic field power supply unit grows in size and its installation space in an MRI apparatus expands.

On the other hand, imaging of high image quality is desired and load on the gradient magnetic field power supply becomes larger in imaging of high image quality.

Thus, in MRI, technology to enable designing circuits of a gradient magnetic field power supply without taking too much margin for capacitance degradation of a charge/discharge element for supplying power such as a capacitor in the gradient magnetic field power supply has been desired.

DETAILED DESCRIPTION

Hereinafter, examples of aspects which embodiments of the present invention can take will be explained per aspect.

(1) According to one embodiment of the present invention, an MRI apparatus performs magnetic resonance imaging, with application of a gradient magnetic field to an imaging region by supplying a gradient magnetic field coil with electric power according to an imaging sequence. This MRI apparatus includes a charge/discharge controlling unit, a judging unit and a condition restricting unit.

The charge/discharge controlling unit includes a charge/discharge element, receives electric power, and charges the charge/discharge element by using the received electric power. The charge/discharge controlling unit supplies the gradient magnetic field coil with electric power discharged from the charge/discharge element at the time of performance of the magnetic resonance imaging.

The judging unit judges whether capacitance of the charge/discharge element falls below a threshold value or not.

The condition restricting unit restricts electric power amount supplied to the gradient magnetic field coil by restricting conditions of the imaging sequence, when the judging unit judges that the capacitance of the charge/discharge element falls below the threshold value.

(2) In another embodiment of the present invention, an MRI method is a method of applying a gradient magnetic field to an imaging region by supplying a gradient magnetic field coil with electric power according to an imaging sequence, acquiring MR signals from the imaging region with the application of the gradient magnetic field, and reconstructing imaging data based on the MR signals. This MRI method includes the following steps.

One of the steps is to judge whether or not capacitance of "a charge/discharge element supplying the gradient magnetic field coil with electric power as discharge current" falls below a threshold value.

The other of the steps is to restrict electric power amount supplied to the gradient magnetic field coil by restricting conditions of the imaging sequence, when the capacitance of the charge/discharge element falls below the threshold value.

An MRI apparatus and an MRI method according to embodiments of the present invention will be described with reference to the accompanying drawings. Note that the same reference numbers are given for identical components in each figure, and overlapping explanation is abbreviated.

(First Embodiment)

Figure 1:
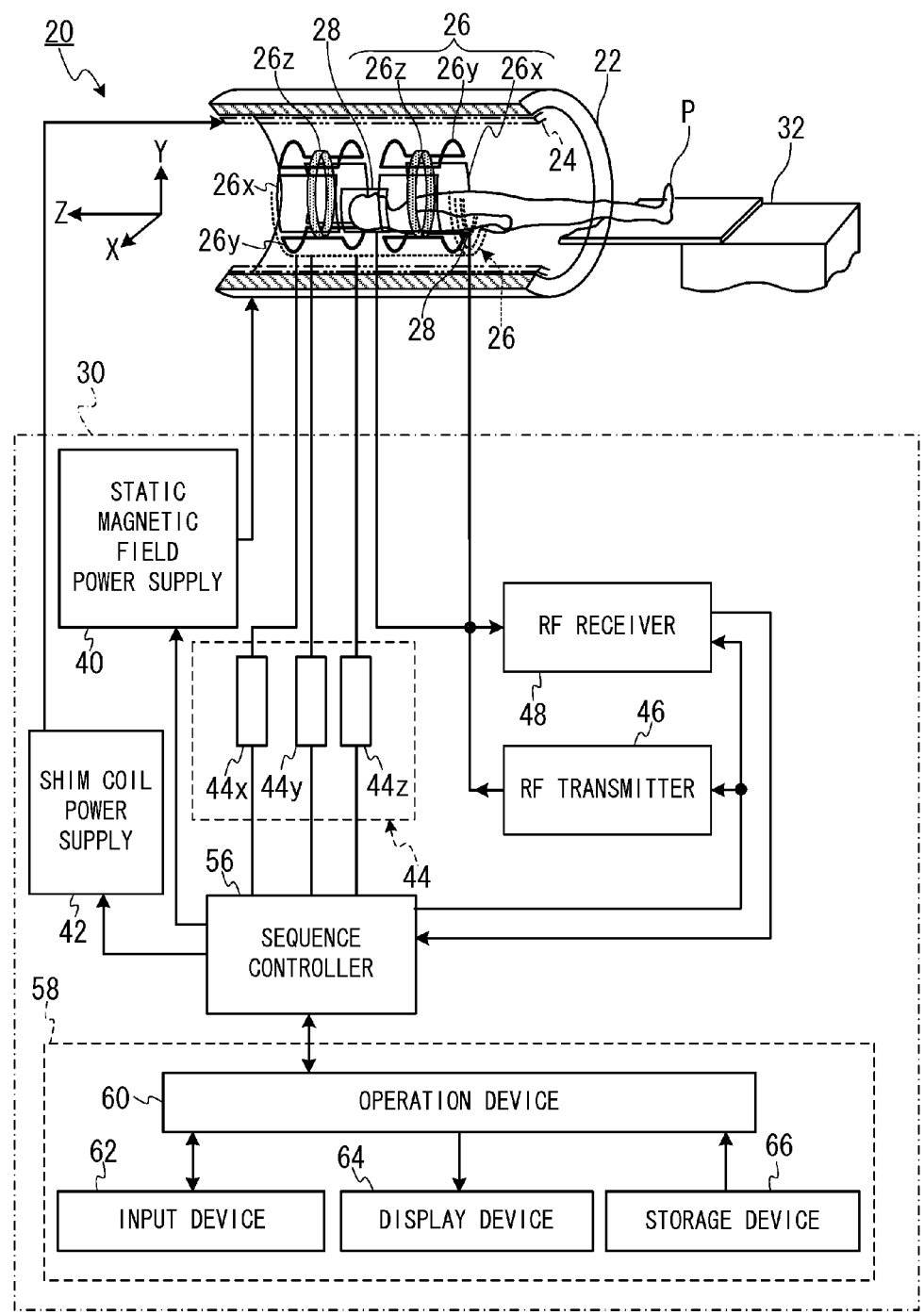
FIG. 1 is a block diagram showing general structure of the MRI apparatus of the first embodiment.

FIG. 1 is a block diagram showing general structure of the MRI apparatus 20 according to the first embodiment of the present invention.

As shown in FIG. 1, the MRI apparatus 20 includes a cylinder-shaped static magnetic field magnet 22 for generating a static magnetic field, a cylinder-shaped shim coil 24 coaxially-arranged inside the static magnetic field magnet 22, a gradient magnetic field coil 26, RF coils 28 (for transmission and reception), a control device 30, and a bed 32 for placing an object (e.g. a patient) P on it.

Here, as one example, an apparatus coordinate system, whose X axis, Y axis and Z axis are perpendicular to each other, is defined as follows.

Firstly, the direction of an axis of the static magnetic field magnet 22 and the shim coil 24 is aligned with the direction which is perpendicular to the vertical direction, and the direction of the axis of the static magnetic field magnet 22 and the shim coil 24 is defined as the Z axis direction.

Additionally, it is assumed that the vertical direction is the same as the Y axis direction.

Moreover, the bed 32 is disposed in such a position that the direction of the normal line of the table plane thereof on which an object P is put is the same as the Y axis direction.

The control device 30 includes a static magnetic field power supply 40, a shim coil power supply 42, a gradient magnetic field power supply 44, an RF transmitter 46, an RF receiver 48, a sequence controller 56 and a computer 58.

The gradient magnetic field power supply 44 includes an X axis gradient magnetic field power supply 44x, a Y axis gradient magnetic field power supply 44y and a Z axis gradient magnetic field power supply 44z.

The computer 58 includes an operation device 60, an input device 62, a display device 64 and a storage device 66.

The static magnetic field magnet 22 is electrically connected to the static magnetic field power supply 40 and generates a static magnetic field in an imaging space by using an electric current supplied from the static magnetic field power supply 40.

The aforementioned "imaging space" means, for example, a space in a gantry in which an object P is placed and to which a static magnetic field is applied. The term "gantry" refers to a structure having a cylindrical shape, for example, which includes the static magnetic field magnet 22, the shim coil 24, the gradient magnetic field coil 26, and the RF coils 28. The gantry and the bed 32 are configured in such a manner that the table of the bed 32 on which the object P is placed can move to the inside of the gantry. For simplicity, FIG. 1 does not show the gantry itself but shows the static magnetic field magnet 22, the shim coil 24, the gradient magnetic field coil 26 and the RF coils 28 in the gantry as components of the gantry.

The "imaging region" means, for example, a region set as a part of the imaging space and is a range of acquisition of MR signals used to generate one image or one set of images. The one image or one set of images may be a two-dimensional image or a three-dimensional image. Here, one set of images means, for example, a plurality of images when MR signals of the plurality of images are acquired in a lump in one pulse sequence such as multi-slice imaging. The imaging region is defined three-dimensionally in an apparatus coordinate system, for example.

The shim coil 24 is electrically connected to the shim coil power supply 42 and uniforms the static magnetic field with the electric current supplied from the shim coil power supply 42.

The static magnetic field magnet 22 includes a superconductivity coil in many cases. The static magnetic field magnet 22 gets an electric current from the static magnetic field power supply 40 at excitation. However, once excitation has been made, the static magnetic field magnet 22 is usually isolated from the static magnetic field power supply 40. The static magnetic field magnet 22 may include a permanent magnet which makes the static magnetic field power supply 40 unnecessary.

The gradient magnetic field coil 26 includes an X axis gradient magnetic field coil 26x, a Y axis gradient magnetic field coil 26y and a Z axis gradient magnetic field coil 26z. Each of the X axis gradient magnetic field coil 26x, the Y axis gradient magnetic field coil 26y and the Z axis gradient magnetic field coil 26z is cylinder-shaped and arranged inside the static magnetic field magnet 22.

The X axis gradient magnetic field coil 26x, the Y axis gradient magnetic field coil 26y and the Z axis gradient magnetic field coil 26z are electrically connected to the X axis gradient magnetic field power supply 44x, the Y axis gradient magnetic field power supply 44y and the Z axis gradient magnetic field power supply 44z of the gradient magnetic field power supply 44 respectively.

The X axis gradient magnetic field power supply 44x, the Y axis gradient magnetic field power supply 44y and the Z axis gradient magnetic field power supply 44z respectively supply electric currents to the X axis gradient magnetic field coil 26x, the Y axis gradient magnetic field coil 26y and the Z axis gradient magnetic field coil 26z, so as to generate a gradient magnetic field Gx in the X axis direction, a gradient magnetic field Gy in the Y axis direction and a gradient magnetic field Gz in the Z axis direction in the imaging region.

That is, directions of a gradient magnetic field Gss in a slice selection direction, a gradient magnetic field Gpe in a phase encoding direction and a gradient magnetic field Gro in a readout (frequency encoding) direction can be arbitrarily set as logical axes, by combining the gradient magnetic fields Gx, Gy and Gz in the X axis direction, the Y axis direction and the Z axis direction as three physical axes.

The gradient magnetic fields Gss, Gpe and Gro in the slice selection direction, the phase encoding direction and the readout direction are superimposed on the static magnetic field.

The RF transmitter 46 generates RF pulses (RF pulse electric current) in accordance with control information provided from the sequence controller 56, and outputs the generated RF pulses to the transmission RF coil 28.

The RF coils 28 include a whole body coil built in the gantry for transmission and reception of RF pulses and local coils arranged around the bed 32 or the object P for reception of RF pulses.

The RF coil 28 for transmission transmits an RF pulse given from the RF transmitter 46 to the object P. The RF coil 28 for reception receives MR signals generated due to excited nuclear spin inside the object P by the RF pulse and these MR signals are detected by the RF receiver 48.

The RF receiver 48 generates raw data which are digitized complex number data of the MR signals obtained by performing A/D (analogue to digital) conversion after performing predetermined signal processing such as preamplification, intermediate-frequency conversion, phase detection, low-frequency amplification and filtering to the detected MR signals. The RF receiver 48 inputs the generated raw data to the sequence controller 56.

The operation device 60 performs system control of the MRI apparatus 20 in imaging operation, and its function will be explained later with FIG. 2.

The sequence controller 56 stores control information needed in order to make the gradient magnetic field power supply 44, the RF transmitter 46 and the RF receiver 48 drive. The aforementioned control information includes, for example, sequence information describing operation control information such as intensity, application period and application timing of the pulse electric current which should be applied to the gradient magnetic field power supply 44.

The sequence controller 56 generates the gradient magnetic fields Gx, Gy and Gz in the X axis, Y axis and Z axis directions and RF pulses by driving the gradient magnetic field power supply 44, the RF transmitter 46 and the RF receiver 48 according to a predetermined sequence stored. Additionally, the sequence controller 56 receives the raw data of the MR signals inputted from the RF receiver 48, and inputs the raw data to the operation device 60.

Figure 2:
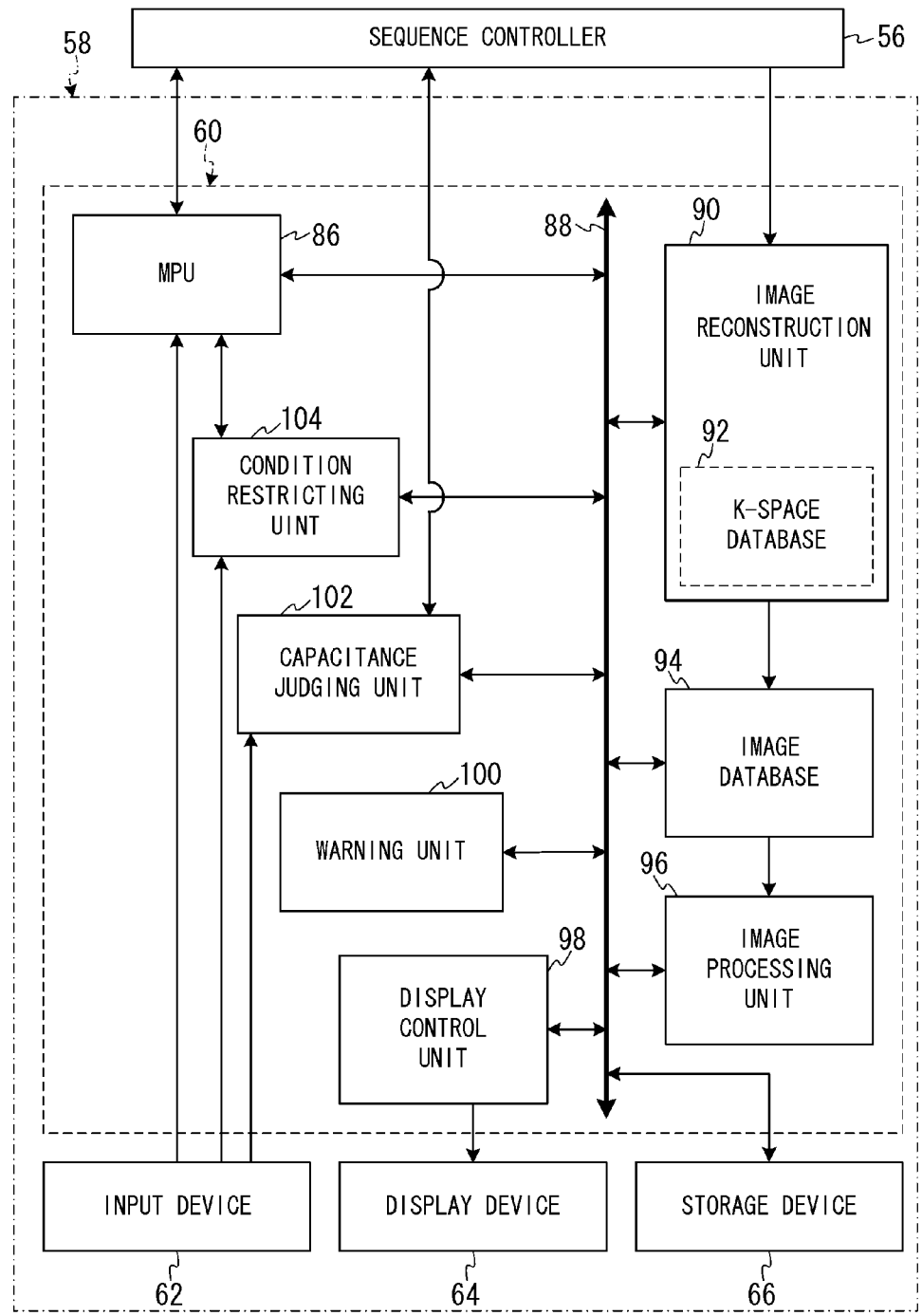
FIG. 2 is a functional block diagram of the computer 58 shown in FIG. 1.

FIG. 2 is a functional block diagram of the computer 58 shown in FIG. 1.

As shown in FIG. 2, the operation device 60 of the computer 58 includes an MPU (Micro Processor Unit) 86, a system bus 88, an image reconstruction unit 90, an image database 94, an image processing unit 96, a display controlling unit 98, a warning unit 100, a capacitance judging unit 102 and a condition restricting unit 104.

The MPU 86 performs system control of the MRI apparatus 20 in setting of conditions of an imaging sequence, imaging operation and image display after imaging through interconnection such as the system bus 88.

Additionally, the MPU 86 functions as an imaging condition setting unit, sets an imaging sequence based on command information from the input device 62, and inputs the set conditions of an imaging sequence into the sequence controller 56. In order to achieve it, the MPU 86 controls the display controlling unit 98 and displays screen information for setting conditions of an imaging sequence on the display device 64.

The aforementioned term "imaging sequence" means how gradient magnetic fields are applied to an imaging region under application of a static magnetic field, under what condition an RF pulse or the like is transmitted in what type of pulse sequence such as of spin echo or EPI, and under what condition MR signals are acquired from an object, for example.

As a condition of the imaging sequence, for example, there are a flip angle, a repetition time (TR), the number of slices, an imaging region as FOV (Field Of View), an imaging part, the number of steps in the phase encoding direction and the frequency encoding direction, and the type of the pulse sequence such as EPI and spin echo.

The above imaging part means a region of the object P to be imaged, such as a head, a chest, an abdomen and a leg.

The input device 62 provides a user with a function to set imaging conditions and image processing conditions.

The image reconstruction unit 90 includes a k-space database 92 inside. The image reconstruction unit 90 arranges the raw data of the MR signals inputted from the sequence controller 56 in the k-space formed in the k-space database 92 as k-space data.

The image reconstruction unit 90 generates image data of each slice of the object P by performing image reconstruction processing including such as two-dimensional Fourier transformation.

The image reconstruction unit 90 stores the generated image data in the image database 94.

The image processing unit 96 takes in the image data from the image database 94, performs predetermined image processing on them, and stores the image data after the image processing in the storage device 66 as display image data.

The storage device 66 stores the display image data after adding accompanying information such as imaging conditions used for generating the display image data and information of the object P (patient information) to the display image data.

The display controlling unit 98 displays a screen for setting imaging conditions and an image indicated by generated image data through imaging on the display device 64 under control of the MPU 86.

The capacitance judging unit 102 obtains the value of the capacitance C of the electrolytic capacitor 126 (see later-described FIG. 3) inside the gradient magnetic field power supply 44 from the capacitance detector 140, and judges whether the capacitance C of the electrolytic capacitor 126 falls below a threshold value or not, based on the obtained capacitance value.

Note that, as referred to hereinafter, in some cases, the capacitance judging unit 102 judges (determines) whether or not the capacitance C of the electrolytic capacitor 126 falls below a threshold value, based on the charging voltage and charge and discharge current (a value of charging current or discharging current) without obtaining the capacitance value.

Note that, the aforementioned charging voltage means, for example, electric potential difference between one electrode and the other electrode of a charge/discharge element such as the electrolytic capacitor 126.

The condition restricting unit 104 restricts electric power supplied to the gradient magnetic field coil 26 by restricting conditions of the imaging sequence set by the MPU 86, if the capacitance judging unit 102 has judged that the capacitance C of the electrolytic capacitor 126 falls below the threshold value. As an example in the first embodiment, threshold values are set in two stages.

That is, the capacitance judging unit 102 judges whether or not the capacitance C of the electrolytic capacitor 126 falls below the first threshold value, and judges whether or not the capacitance C of the electrolytic capacitor 126 falls below the second threshold value which is smaller than the first threshold value.

If the capacitance C of the electrolytic capacitor 126 falls below the second threshold value, the condition restricting unit 104 restricts electric power supplied to the gradient magnetic field coil 26 more than the case where the capacitance C of the electrolytic capacitor 126 does not fall below the second threshold value but falls below the first threshold value.

The warning unit 100 performs exchange recommending display of the electrolytic capacitor 126 (alarm display) on the display device 64 by controlling the display control unit 98, if the capacitance C of the electrolytic capacitor 126 falls below the threshold value.

Figure 3:
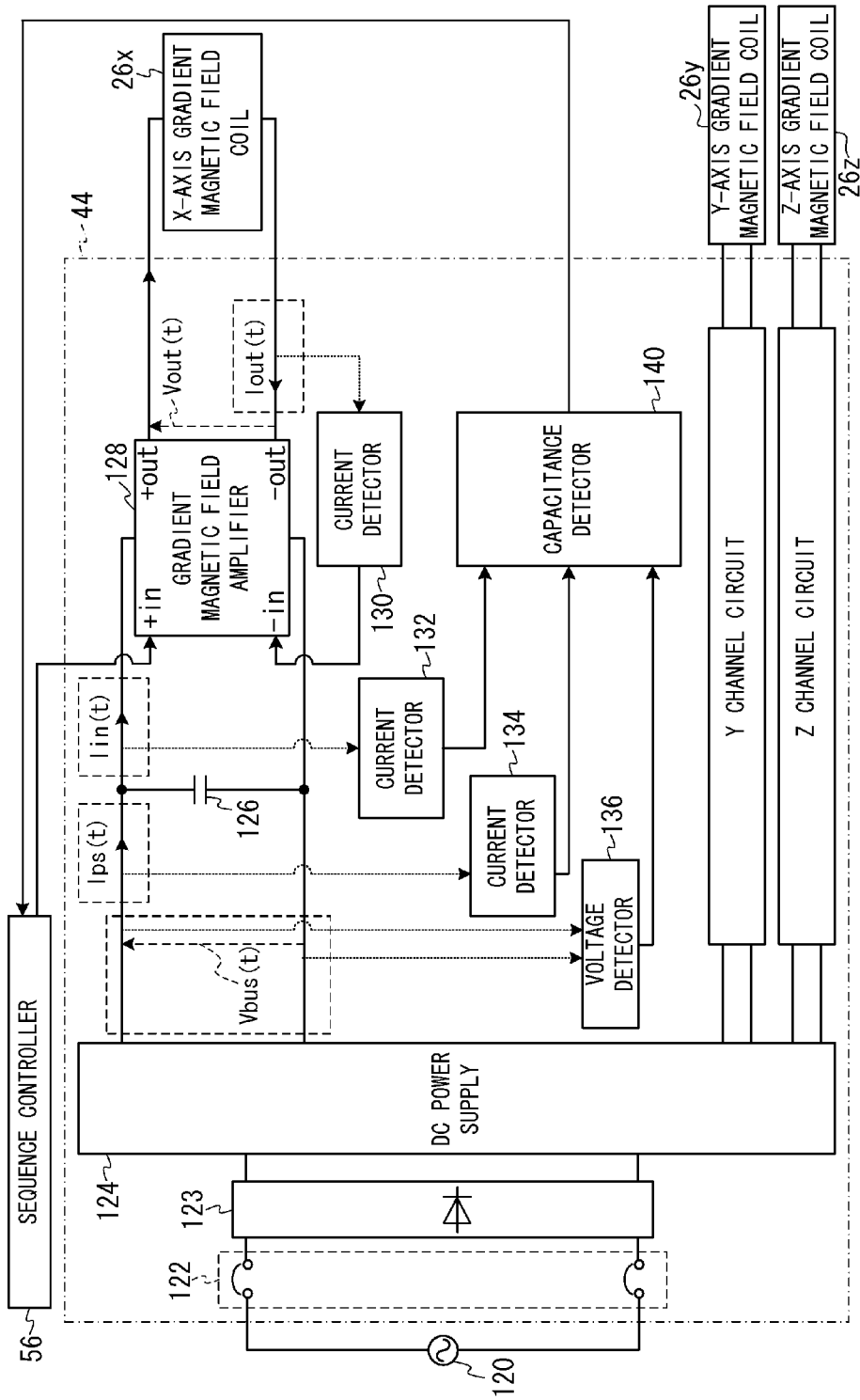
FIG. 3 is a block diagram showing an example of a configuration of a gradient magnetic field power supply in the first embodiment.

FIG. 3 is a block diagram showing an example of a configuration of the gradient magnetic field power supply 44. In order to avoid complication, minute circuit structure is shown only for the X channel part which supplies electric power to the X axis gradient magnetic field coil 26x in FIG. 3.

As shown in FIG. 3, the gradient magnetic field power supply 44 includes a breaker (circuit breaker) 122, a rectifier 123, a direct-current power supply 124, an electrolyte capacitor 126, a gradient magnetic field amplifier 128, current detectors 130, 132 and 134, a voltage detector 136 and a capacitance detector 140.

That is, the X axis gradient magnetic field power supply 44x, the Y axis gradient magnetic field power supply 44y and the Z axis gradient magnetic field power supply 44z shown in FIG. 1 share the breaker 122, the rectifier 123 and the direct-current power supply 124.

The X axis gradient magnetic field power supply 44x shown in FIG. 3 corresponds to the breaker 122, the rectifier 123, the direct-current power supply 124, the electrolyte capacitor 126, the gradient magnetic field amplifier 128 and the current detectors 130, 132 and 134, the voltage detector 136 and the capacitance detector 140, for example.

The breaker 122 electrically disconnects an external alternating-current power supply 120 and the rectifier 123 from each other, when the output electric current from the alternating-current power supply 120 exceeds a rated current value.

The rectifier 123 converts the alternating-current power supplied from the alternating-current power supply 120 into direct-current power, and supplies the direct-current power to the direct-current power supply 124.

The direct-current power supply 124 charges the electrolyte capacitors 126 with the direct current supplied via the rectifier 123, and supplies the direct current to the gradient magnetic field amplifiers 128.

The direct-current power supply 124 has CV/CC characteristics and operates as a constant voltage source, when the load on the side of the gradient magnetic field amplifiers 128 is light. The direct-current power supply 124 operates as a constant current source, when the load on the side of the gradient magnetic field amplifiers 128 is heavy. Note that, CV of CV/CC characteristics is an abbreviation of constant voltage, and CC is an abbreviation of constant current.

The gradient magnetic field amplifier 128 has a positive-side input terminal (+IN in the drawing), a negative-side input terminal (−IN in the drawing), a positive-side output terminal (+OUT in the drawing) and a negative-side output terminal (−OUT in the drawing).

The gradient magnetic field amplifier 128 receives the electric power from the direct-current power supply 124, and receives control voltage signals from the sequence controller 56 at the positive-side input terminal. The control voltage signals have waveforms similar to ideal waveforms of the magnetic fields to be generated by the X axis gradient magnetic field coil 26x according to the imaging sequence.

The current detector 130 detects the value of electric current flowing into the negative-side output terminal of the gradient magnetic field amplifier 128, and the magnitude of the detected electric current is equal to the magnitude of the electric current outputted from the positive-side output terminal of the gradient magnetic field amplifier 128. This is because the electric current outputted from the positive-side output terminal of the gradient magnetic field amplifier 128 is fed back to the negative-side output terminal of the gradient magnetic field amplifier 128 through the gradient magnetic field coil 26x.

(t) of Iout(t) means that the component is a function of time t, and the same holds true for the electric currents and voltages of respective components found in the following description.

The current detector 130 generates a voltage signal indicative of the value of the detected electric current, and inputs the generated voltage signal to the negative-side input terminal of the gradient magnetic field amplifier 128.

The gradient magnetic field amplifier 128 operates as a current source that outputs electric current, in such a manner that the error signal between the positive-side input terminal and the negative-side input terminal becomes zero.

Here, the output electric current of the gradient magnetic field amplifier 128 is negatively fed back by the current detector 130.

Thus, the feedback control occurs, in such a manner that the electric current proportional to the voltage (control voltage signal) inputted to the positive-side input terminal of the gradient magnetic field amplifier 128 is outputted from the positive-side output terminal.

More concretely, the gradient magnetic field amplifier 128 switches between the following first circuit operation state and the second circuit operation state, according to the above control voltage signals and so on.

The first circuit operation state is a state in which the gradient magnetic field amplifier 128 supplies the gradient magnetic field coli 26 with electric power by consuming only the electric power supplied from the direct-current power supply 124 without consuming the accumulated electric power of the electrolytic capacitor 126.

The second circuit operation state is a state in which the accumulated electric power of the electrolytic capacitor 126 is consumed (i.e. the gradient magnetic field amplifier 128 supplies the gradient magnetic field coil 26 with electric power from both of the direct-current power supply 124 and the electrolytic capacitor 126).

That is, the gradient magnetic field amplifier 128 supplements (complements) shortfall of the electric power supplied from the direct-current power supply 124 as compared with power consumption of the gradient magnetic field coil 26 by using the electric power discharged from the electrolytic capacitor 126 according to an imaging sequence. The above according to an imaging sequence means, for example, according to the control voltage signals indicative of waveforms similar to ideal waveforms of the magnetic fields to be generated by the gradient magnetic field coil 26 defined by the imaging sequence.

The current detector 132 detects the value of the electric current flowing in the direction shown in FIG. 3 between the electrolytic capacitor 126 and the gradient magnetic field amplifier 128 (i.e. the electric current supplied to the gradient magnetic field amplifier 128), as the amplifier inflow current Iin(t). The current detector 132 inputs the detected electric current value to the capacitance detector 140.

The current detector 134 detects the value of the electric current flowing in the direction shown in FIG. 3 from the direct-current power supply 124 to the side of the electrolytic capacitor 126 and the gradient magnetic field amplifier 128, as the power source output current Ips(t). The current detector 134 inputs the detected electric current value to the capacitance detector 140.

During the period in which the amplifier inflow current Iin(t) is larger then the power source output current Ips(t), the amplifier inflow current Iin(t) includes the discharging current from the electrolytic capacitor 126. In this period, the electrolytic capacitor 126 supplies the gradient magnetic field coil 26x with electric power as the discharging current via the gradient magnetic field amplifier 128.

The voltage detector 136 detects the value of the output voltage supplied from the direct-current power supply 124 to the X channel side, as Vbus(t), and inputs the detected voltage value to the capacitance detector 140. Because the output voltage Vbus(t) of the direct-current power supply 124 is equal to the charging voltage of the electrolytic capacitor 126, this is described as the charging voltage Vbus (t) in the following explanation if the charging voltage of the electrolytic capacitor 126 is focused on.

The capacitance detector 140 calculates the value of the capacitance C of the electrolytic capacitor 126 based on the amplifier inflow current Iin(t), the power source output current Ips(t) and the charging voltage Vbus(t). The capacitance detector 140 inputs the calculated capacitance value to the capacitance judging unit 102 via the sequence controller 56.

Although minute circuit configuration is omitted in FIG. 3, each of the Y channel circuit and the Z channel circuit of the gradient magnetic field power supply 44 has the structure similar to the aforementioned X channel circuit, and functions in the way similar to the X channel circuit. However, the electric power supplied from the direct-current power supply 124 to the gradient magnetic field amplifier 128 side is different between each channel of X, Y, and Z. Thus, the capacitance C of the electrolytic capacitor 126 is separately calculated for each channel of X, Y and Z, and respectively inputted to the capacitance judging unit 102.

Next, methods of calculating the capacitance C of the electrolytic capacitor 126 by the capacitance detector 140 will be explained.

As the first method, the capacitance detector 140 calculates the value of the capacitance C in terms of inflow to and outflow to the electrolytic capacitor 126 at the time of charging.

More specifically, the charging current flowing into the electrolytic capacitor 126 becomes a value obtained by subtracting the amplifier inflow current Iin(t) from the power source output current Ips(t). Therefore, the capacitance detector 140 calculates the variation amount ΔQ of electric charge of the electrolytic capacitor 126 based on time integration value of the power source output current Ips(t) and the amplifier inflow current Iin(t), according to the following formula (1).

$$\Delta Q = \int Ips(t) - Iin(t) dt \quad (1)$$

Additionally, the capacitance detector 140 can calculate the variation amount ΔVbus of the charging voltage of the electrolytic capacitor 126 during the period for which time integration is performed by the formula (1), based on the charging voltage Vbus(t) inputted at sufficiently short constant time interval from the voltage detector 136. The capacitance detector 140 calculates the capacitance C of the electrolytic capacitor 126 by using the following formula (2).

$$C = \Delta Q / \Delta Vbus \quad (2)$$

Figure 4:
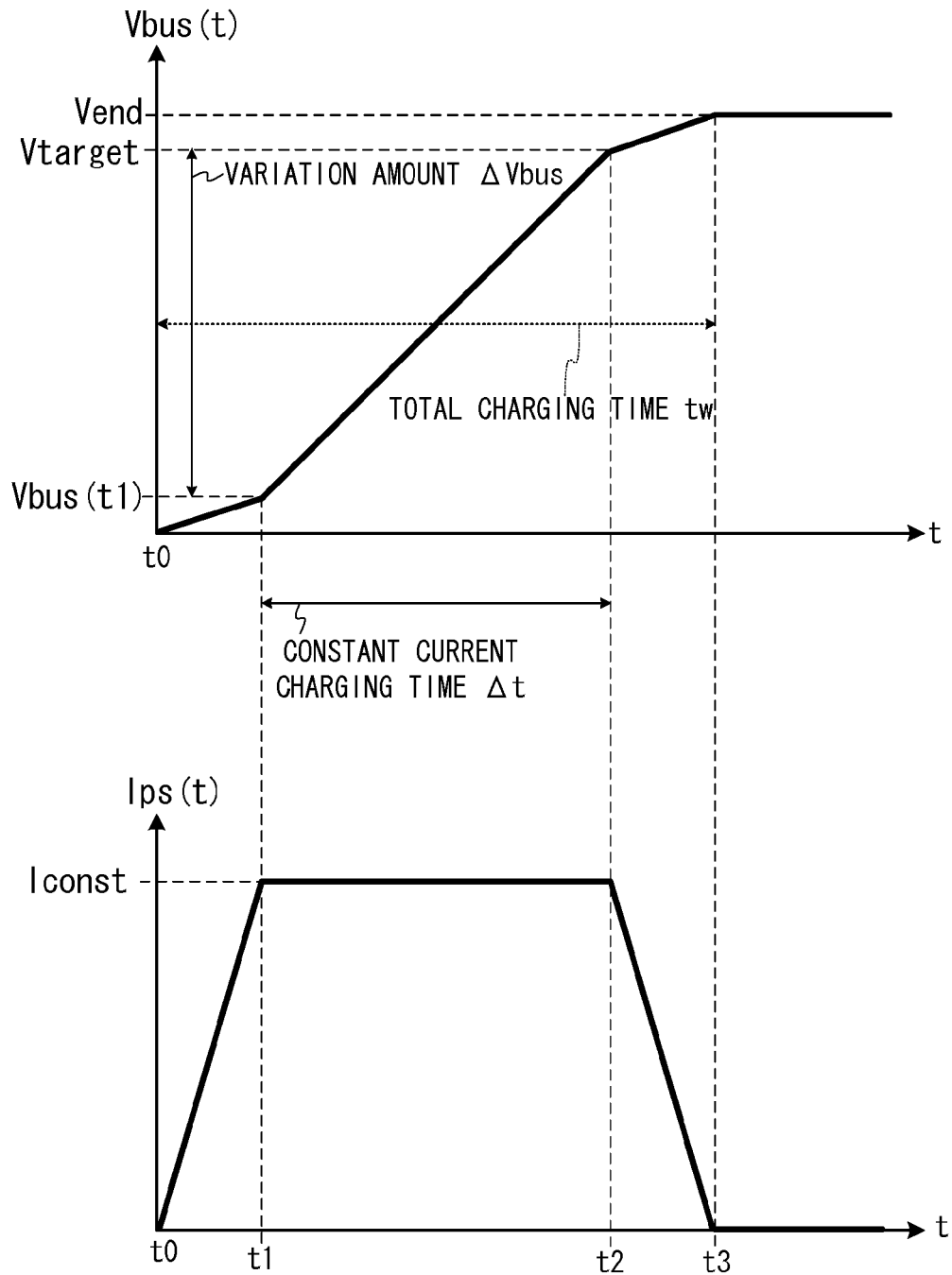
FIG. 4 is a schematic diagram showing an example of time variation of the charging voltage Vbus(t) of the electrolytic capacitor and the power source output current Ips(t) from the direct-current power supply in FIG. 3.

FIG. 4 is a schematic diagram showing an example of time variation of the charging voltage Vbus(t) of the electrolytic capacitor 126 and the power source output current Ips(t) from the direct-current power supply 124.

In FIG. 4, the vertical axis in the upper graph indicates the charging voltage Vbus(t), the vertical axis in the lower graph indicates the power source output current Ips(t), and the abscissa axis of both graphs indicates elapsed time t.

As an example in FIG. 4, charging of the electrolytic capacitor 126 is started from time t0. Initial rise finishes and the condition of Ips(t)=Iconst is satisfied at time t1.

During the period between time t1 and time t2, constant current charge is performed by the current value of Iconst.

At time t2, the charging voltage of the electrolytic capacitor 126 reaches the target voltage Vtarget and the power source output current Ips(t) starts falling.

Moreover, at time t3, charging finishes and the charging voltage Vbus (t) of the electrolytic capacitor 126 becomes Vend. Note that, the period from time t0 to time t3 is defined as the total charging time tw.

As the second method of calculating the capacitance C of the electrolytic capacitor 126, calculation is performed during the charging time in the following manner.

More specifically, consider a case where initial rise of the power source output current Ips(t) and fall time (trailing edge) of the power source output current Ips (t) from the time when the charging voltage Vbus (t) of the electrolytic capacitor 126 reaches the target voltage Vtarget are fast enough to be ignored, and the amplifier inflow current Iin(t) is approximately zero.

That is, consider a case where the period between time t0 and time t1 and the period between time t2 and time t1 in FIG. 4 are short enough to be ignored like initial charging time just after power activation of the MRI apparatus 20, for example.

In this case, because the direct-current power supply 124 can be regarded as a constant current source over the total charging time tw of the electrolytic capacitor 126, the capacitance C of the electrolytic capacitor 126 can be calculated by the following formula (3).

$$C = Iconst \times tw / Vend \quad (3)$$

In the second method, in order to calculate the capacitance C of the electrolytic capacitor 126 more precisely, measurement may be performed by avoiding the risetime of the charging current (the power source output current Ips (t)) and the fall time of the charging current.

Alternatively, the capacitance C may be calculated by removing data of the risetime and fall time from the measured data. More specifically, the capacitance detector 140 makes the voltage detector 136 detect the variation amount ΔVbus of the charging voltage of the electrolytic capacitor 126 in the constant current charge period Δt (period between time t1 and time t2) during which the electrolytic capacitor 126 is charged by a constant current as shown in FIG. 4, and may calculate the capacitance C of the electrolytic capacitor 126 by the following formula.

$$C = I\text{const} \times \Delta t / \Delta V\text{bus} \quad (4)$$

Alternatively, the variation amount of the charging voltage of the electrolytic capacitor 126 during an arbitrary part of the constant current charge period Δt may be measured, and the capacitance C of the electrolytic capacitor 126 may be calculated based on the measured variation amount in the way similar to formula (4).

As the third method of calculating the capacitance C of the electrolytic capacitor 126, for example, consider a case where the power source output current Ips(t) is zero like the time of forced discharge, i.e. a case where the amplifier inflow current Iin(t) can be regarded as electric current consisting of only the discharging current from the electrolytic capacitor 126.

In this case, the current detector 132 and the voltage detector 136 respectively measure time variations of the amplifier inflow current Iin(t) and the charging voltage Vbus(t), and the capacitance detector 140 calculates the capacitance C of the electrolytic capacitor 126 based on those measured values.

More specifically, for example, consider a case where the amplifier inflow current Iin(t) is constant at Iconst' over a period Δt'. The absolute value ΔVbus' of a drop amount of the charging voltage Vbus(t) over the period Δt' is measured, and the capacitance C may be calculated by the following formula, for example.

$$C = I\text{const}' \times \Delta t' / \Delta V\text{bus}' \quad (5)$$

Note that, it is not necessary to calculate the value of the capacitance C of the electrolytic capacitor 126 like the above first to third methods. Hereinafter, such a judging method of degradation degree of the capacitance C of the electrolytic capacitor 126 (without calculating the value of the capacitance C) will be explained.

Figure 5:
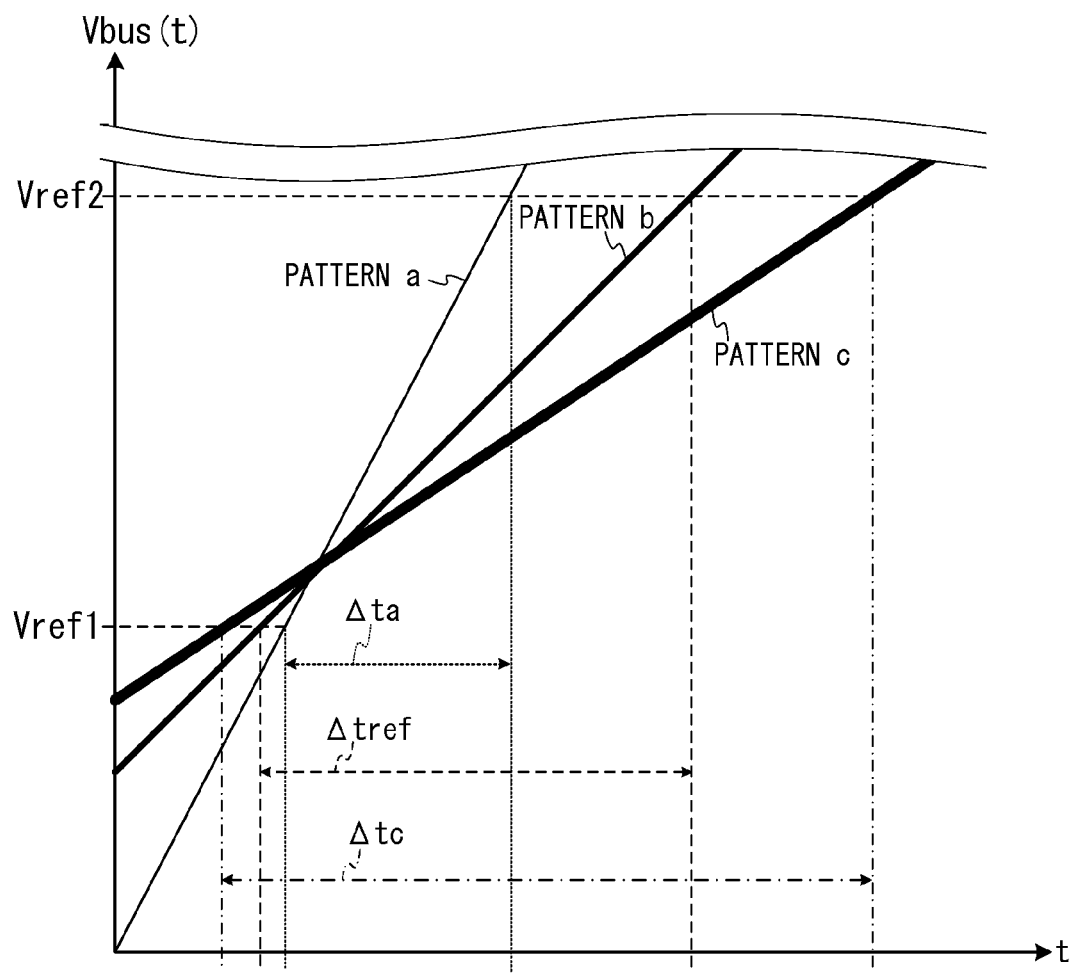
FIG. 5 is a schematic diagram showing the difference in time variation of the charging voltage between each capacitance value, in the case where the amplifier inflow current can be regarded as zero and the electrolytic capacitor is charged by a constant power source output current.

FIG. 5 is a schematic diagram showing the difference in time variation of the charging voltage Vbus(t) between each capacitance value, in the case where the amplifier inflow current Iin(t) can be regarded as zero and the electrolytic capacitor 126 is charged with a constant current by the power source output current Ips(t).

In FIG. 5, the vertical axis indicates the charging voltage Vbus(t), the abscissa axis indicates elapsed time t. In FIG. 5, three patterns of mutually different capacitance values are shown. Rising of the charging voltage Vbus(t) is fast in the pattern a indicated as the finest solid line, but rising of the charging voltage Vbus(t) is slow in the pattern c indicated as the heaviest solid line. The pattern b is intermediate between the pattern a and the pattern c, and it is assumed that the capacitance C of the electrolytic capacitor 126 is equal to a threshold Cref in the pattern b.

In the pattern a, pattern b and pattern c, the power source output current Ips(t) is respectively constant at Iconst over the period shown in FIG. 5, and it is assumed that the electrolytic capacitor 126 is charged by the power source output current Ips(t).

In this constant current charge period, each temporal difference between the time when the charging voltage Vbus(t) reaches the first criterion value Vref1 and the time when the charging voltage Vbus(t) reaches the second criterion value Vref2 is defined as Δta for the pattern a, Δtref for the pattern b and Δtc for the pattern c. In this case, the amount of electric charge Q flowing into the electrolytic capacitor 126 can be given by the following formula in the pattern b.

As is clear from the above formula, in general, the smaller capacitance of a capacitor is, the faster its rising of the charging voltage under constant current charge becomes. That is, in the pattern a, rising of the charging voltage is fast, because the capacitance of the electrolytic capacitor 126 is small.

On the other hand, in the pattern c, rising of the charging voltage is slow, because the capacitance of the electrolytic capacitor 126 is large.

Then, the voltage detector 136 measures time variation of the charging voltage Vbus(t) of the electrolytic capacitor 126 during the constant current charge period, and inputs this measurement result to the capacitance judging unit 102 via the capacitance detector 140.

The capacitance judging unit 102 calculates the temporal difference between the time when the charging voltage Vbus(t) reaches the first criterion value Vref1 and the time when the charging voltage Vbus(t) reaches the second criterion value Vref2. If the temporal difference is shorter than Δtref, the capacitance judging unit 102 judges that the capacitance C of the electrolytic capacitor 126 falls below the threshold Cref.

As just described, the degradation degree of the capacitance C of the electrolytic capacitor 126 may be judged by monitoring the time necessary for the charging voltage Vbus(t) to reach a predetermined value and comparing the monitored time with the criterion time (Δtref). The above degradation means, for example, whether capacitance falls below a threshold or not (the same applies to the following explanation).

Alternatively, the degradation degree of the capacitance C of the electrolytic capacitor 126 may be judged in the way similar to the above manner during discharge time when the power source output current Ips(t) can be regarded as zero and the amplifier inflow current Iin(t) can be regarded as a constant value.

That is, the voltage detector 136 measures the time needed for the charging voltage Vbus(t) to rise from the first predetermined value to the second predetermined value, and inputs this measurement result to the capacitance judging unit 102 via the capacitance detector 140. The capacitance judging unit 102 may judge whether or not the capacitance C of the electrolytic capacitor 126 falls below the threshold, by comparing the criterion time (Δtref') with the time needed for the charging voltage Vbus (t) to rise from the first predetermined value to the second predetermined value.

Alternatively, the voltage detector 136 may measure an elevated value of the charging voltage Vbus(t) of the electrolytic capacitor 126 within a predetermined time period in charging time when the amplifier inflow current Iin(t) can be regarded as zero and the power source output current Ips(t) as the charging current can be regarded as a constant value, and input the measurement result to the capacitance judging unit 102. The capacitance judging unit 102 can judge the degradation degree of the capacitance C of the electrolytic capacitor 126, by comparing the criterion elevated value with this measured elevated value.

Similarly, the voltage detector 136 may measure a declination value of the charging voltage Vbus(t) of the electrolytic capacitor 126 within a predetermined time period in discharging time when the power source output current Ips(t) can be regarded as zero and the amplifier inflow current Iin(t) can be regarded as a constant value, and input the measurement result to the capacitance judging unit 102. The capacitance judging unit 102 can judge the degradation degree of the capacitance C of the electrolytic capacitor 126, by comparing the criterion declination value with this measured declination value.

Figure 6:
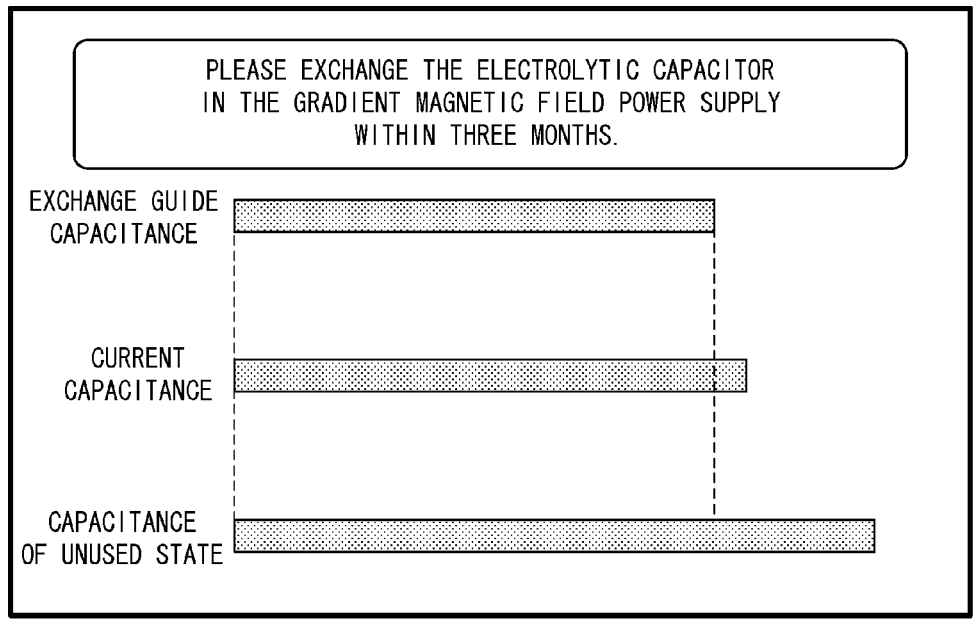
FIG. 6 is a schematic diagram showing an example of display which recommends exchanging the electrolytic capacitor according to its capacitance.

FIG. 6 is a schematic diagram showing an example of display which recommends exchange of the electrolytic capacitor 126 according to its capacitance C. As an example in the first embodiment, as a rough indication of exchange of the electrolytic capacitor 126, the first threshold value Cref1 and the second threshold value Cref2 are used. The second threshold value Cref2 is smaller than the first threshold value Cref1. The first threshold value Cref1 is smaller than the capacitance value of the electrolytic capacitor 126 before it is used.

FIG. 6 corresponds to a case where the value of the capacitance C of the electrolytic capacitor 126 falls below the first threshold value Cref1 but surpasses the second threshold value Cref2. In this case, the warning unit 100 performs exchange recommendation display on the display device 64 by controlling the display control unit 98, with a textual message such as Please exchange the electrolytic capacitor inside the gradient magnetic field power source within three months, for example.

At the same time, the warning unit 100 makes the display device 64 display the calculated value of the capacitance C of the electrolytic capacitor 126, the capacitance value of the electrolytic capacitor 126 of unused state and the capacitance value of the second threshold value Cref2 with bar style. As an example here, it is assumed that the second threshold value Cref2 is equal to the exchange guide capacitance shown in FIG. 6.

Figure 7:
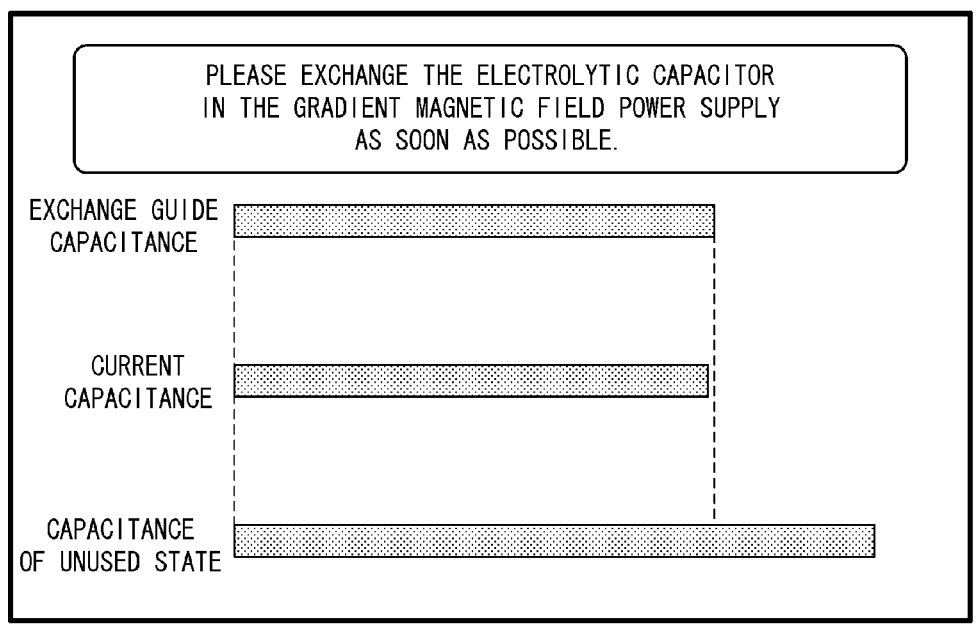
FIG. 7 is a schematic diagram showing another example of display which recommends exchange of the electrolytic capacitor according to its capacitance.

FIG. 7 is a schematic diagram showing another example of display which recommends exchange of the electrolytic capacitor 126 according to its capacitance C. FIG. 7 corresponds to a case where the value of the capacitance C of the electrolytic capacitor 126 falls below the second threshold value Cref2. In this case, the warning unit 100 performs the exchange recommendation display on the display device 64 with a textual message such as "Please exchange the electrolytic capacitor inside the gradient magnetic field power source as soon as possible", for example.

At the same time, the warning unit 100 makes the display device 64 display the calculated value of the capacitance C of the electrolytic capacitor 126, the capacitance value of the electrolytic capacitor 126 of unused state and the capacitance of the second threshold value Cref2 with bar style.

Figure 8:
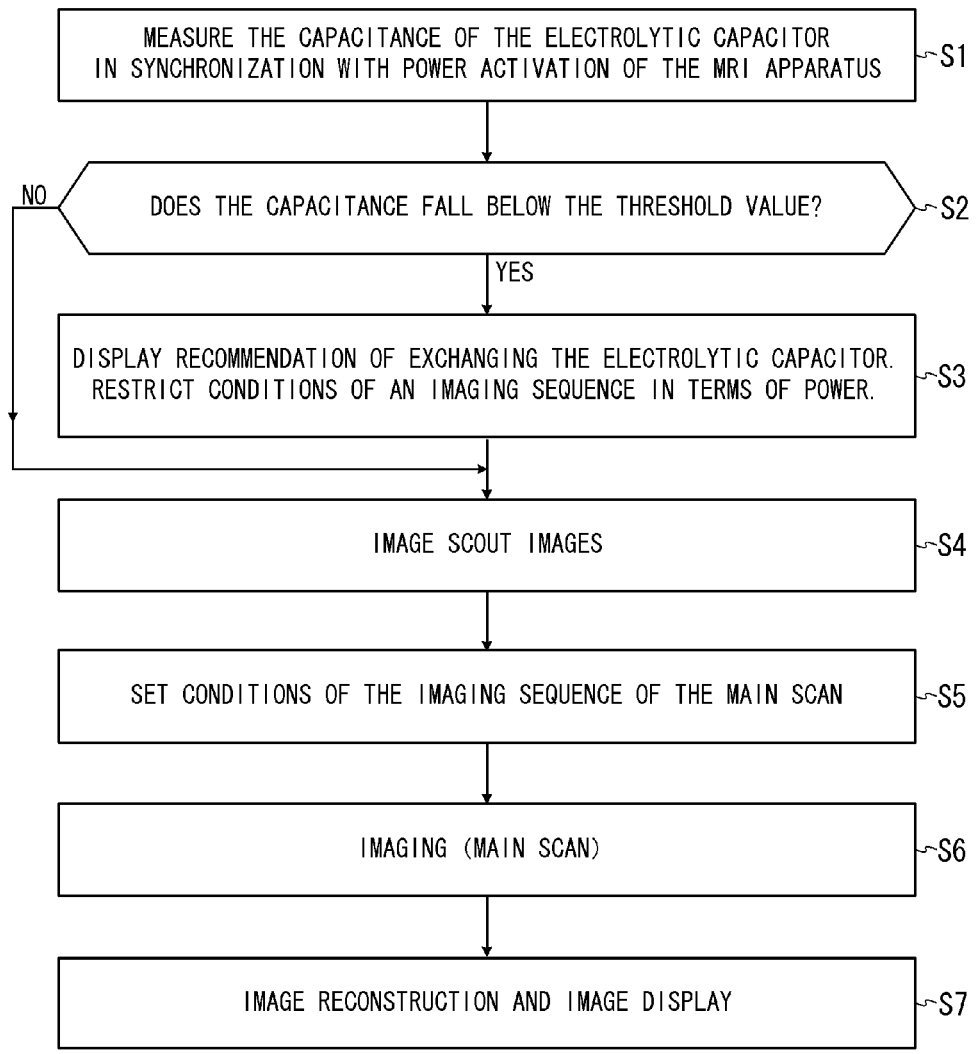
FIG. 8 is a flowchart illustrating an example of a flow performed by the MRI apparatus of the first embodiment.

FIG. 8 is a flowchart illustrating an example of a flow of a process performed by the MRI apparatus 20 of the first embodiment. As an example in FIG. 8, a case where the measurement and the judgment are performed just after power activation of the MRI apparatus 20 will be explained.

In the following, according to the step numbers in the flowchart shown in FIG. 8, an operation of the MRI apparatus 20 will be described by referring to the aforementioned FIG. 1 to FIG. 7 as required.

[Step S1] Power activation is performed on the MRI apparatus 20, and the MRI apparatus 20 starts its operation. Note that, in the case of the ramp-up period, the remanent charge of the electrolytic capacitor 126 can be regarded as approximately zero and the amplifier inflow current Iin(t) can be regarded as zero, because a certain period of time has elapsed from the shutdown of the MRI apparatus 20.

In synchronization with the power activation of the MRI apparatus 20 (start of the operation of the MRI apparatus 20), the electric power supply from the alternating-current power supply 120 to the direct-current power supply 124 inside the gradient magnetic field power supply 44 starts.

In synchronization with the start of the electric power supply to the direct-current power supply 124, the current detectors 132 and 134 and the voltage detector 136 respectively start measuring the amplifier inflow current Iin(t), the power source output current Ips(t) and the charging voltage Vbus(t) at sufficiently short constant time interval, and input respective measured values to the capacitance detector 140.

The above sufficiently short means such a short time interval that time variation of the charging voltage Vbus(t) can be judged and the capacitance C of the electrolytic capacitor 126 can be accurately calculated (the same applies to the second embodiment).

The capacitance detector 140 calculates the capacitance C of the electrolytic capacitor 126, based on the measured values from the fully discharged state to the charged state of the electrolytic capacitor 126. As to calculation methods of this capacitance C, for example, the first method or the second method explained by using the formulas (1) to (4) may be used.

After this, the process proceeds to Step S1.

[Step S2] The capacitance detector 140 inputs the calculated capacitance C of the electrolytic capacitor 126 to the capacitance judging unit 102 via the sequence controller 56. The capacitance judging unit 102 makes the storage device 66 store the value of the capacitance C, its measurement date (by year-month-day format) and the clock time when the capacitance C is calculated.

The capacitance judging unit 102 preliminarily stores the capacitance value of the unused state of the electrolytic capacitor 126, the first threshold value Cref1, and the second threshold value Cref2 which is smaller than the first threshold value Cref1, from the time when the electrolytic capacitor 126 was exchanged previous time, or from the time when installation arrangement of the MRI apparatus 20 was performed, for example.

If the capacitance C falls below the second threshold value Cref2, this is a case where it is desirable to exchange the electrolytic capacitor 126 as soon as possible. Note that, respective setting values of the first threshold value Cref1 and the second threshold value Cref2 can be varied per each channel of X, Y and Z via the input device 62 depending on the capacitance value of unused state (pristine condition).

The capacitance judging unit 102 judges whether the capacitance C of the electrolytic capacitor 126 falls below the first threshold value Cref1 or not. Additionally, the capacitance judging unit 102 judges whether the capacitance C of the electrolytic capacitor 126 falls below the second threshold value Cref2 or not.

The capacitance judging unit 102 inputs these judgment results and the value of the capacitance C to the warning unit 100 and the condition restricting unit 104 respectively. Note that, if the MRI apparatus 20 is connected to a maintenance service organization (not shown in the drawings), the capacitance judging unit 102 may send these judgment results and the value of the capacitance C to the maintenance service organization.

The capacitances of the electrolytic capacitors 126 are separately calculated for each channel of X, Y and Z, and are respectively inputted to the capacitance judging unit 102. As an example here, if any one of the capacitance C of the electrolytic capacitor 126 out of the X, Y and Z channels falls below the first threshold value, the process proceeds to Step S3. If this is not the case, the process proceeds to Step S4.

[Step S3] Depending on the judgment results in Step S2, the calculation process is explained by dividing into the following two cases.

The first case is a case where the value of the capacitance C falls below the first threshold value Cref1 in at least one of the X, Y and Z channels and the value of the capacitance C surpasses the second threshold value Cref2 in all of the X, Y and Z channels. In the first case, the warning unit 100 performs the exchange recommendation display on the display device 64 by controlling the display control unit 98, with a textual message such as "Please exchange the electrolytic capacitor inside the gradient magnetic field power source within three months", for example. At the same time, the warning unit 100 makes the display device 64 display the calculated value of the capacitance C of the electrolytic capacitor 126, the value of the capacitance of the electrolytic capacitor 126 of the unused state and the value of the exchange guide capacitance with bar style (see FIG. 6). Thereby, the warning unit 100 recommends that a user should make preparations for exchange of the electrolytic capacitor 126 sometime in the near future.

Additionally, in the first case, the condition restricting unit 104 alters upper limits and lower limits of some of the conditions (parameters) of the imaging sequence so as to reduce the upper limit of power consumption of the gradient magnetic field coil 26 in the later-described way, and inputs the altered conditions to the MPU 86. That is, the condition restricting unit 104 restricts the power consumption of the gradient magnetic field coil 26 by restricting the conditions of the imaging sequence in terms of electric power. Thereby, the condition restricting unit 104 lightens the electric load of the gradient magnetic field power supply 44.

The condition restricting unit 104 restricts the conditions of the imaging sequence in terms of electric power depending on the value of the capacitance C, to such a degree that the imaging sequence remains practicable and satisfactory image quality is maintained even if the conditions of the imaging sequence are set so as to give the maximum electric load within the settable range.

As a method of lightening the electric load on the gradient magnetic field power supply 44 by decreasing the power consumption of the gradient magnetic field coil 26, for example, at least one of the following options can be selected. They are lengthening a repetition time TR, decreasing the number of imaged slices, expanding FOV which is an imaging region and lowering resolution of imaging. In other words, at least one of (a) lengthen the lower limit of the repetition time TR, (b) decreasing the upper limit of the number of imaged slices, (c) expanding the minimum dimension settable as FOV which is an imaging region and (d) lowering the upper limit of the resolution of imaging can be selected. Note that, for example, in the case of DWI (Diffusion Weighted Imaging), the electric load may be lightened by lowering b-factor so as to weaken the intensity of MPG (Motion Probing Gradient) pulses.

The aforementioned resolution of imaging means how wide the range of the object indicated by one pixel of an MRI image is. This can be determined by the size of FOV which is an imaging region and the number of the matrix elements defined by the phase encode direction step number and the frequency encode direction step number. That is, in order to lower the resolution of imaging, for example, the step numbers of the phase encode direction and the frequency encode direction may be decreased, or FOV which is an imaging region may be widened.

As the second case, a case where the value of the capacitance C falls below the second threshold value Cref2 will be explained. As an example here, the second case includes a case where the value of the capacitance C of the electrolytic capacitor 126 falls below the second threshold value Cref2 in any one of the X, Y and Z channels.

In the second case, the warning unit 100 performs the exchange recommendation display on the display device 64 by controlling the display control unit 98 with a textual message such as "Please exchange the electrolytic capacitor inside the gradient magnetic field power source as soon as possible", for example. At the same time, the warning unit 100 makes the display device 64 display the calculated value of the capacitance C of the electrolytic capacitor 126, the capacitance value of the electrolytic capacitor 126 of the unused state and the value of the exchange guide capacitance with bar style (see FIG. 7). Thereby, the warning unit 100 recommends that a user should make immediate preparations for exchange of the electrolytic capacitor 126.

Additionally, in the second case, the condition restricting unit 104 alters the upper limits and lower limits of some of the conditions (parameters) of the imaging sequence so as to reduce the upper limit of power consumption of the gradient magnetic field coil 26 more than the first case, and inputs the altered conditions to the MPU 86. Thereby, the condition restricting unit 104 lightens the electric load of the gradient magnetic field power supply 44 more than the first case.

The condition restricting unit 104 restricts the conditions of the imaging sequence in terms of electric power depending on the value of the capacitance C, to such a degree that the imaging sequence remains practicable and satisfactory image quality is maintained even if the conditions of the imaging sequence are set so as to give the maximum electric load within the settable range.

After this, the process proceeds to Step S4.

[Step S4] The MPU 86 (see FIG. 2) performs initial setting of the MRI apparatus 20 based on conditions of an imaging sequence inputted to the MRI apparatus 20 via the input device 62. Additionally, the center frequency of RF pulses is set by a prescan and so on. After this, the MPU 86 makes the MRI apparatus 20 perform data acquisition (collection of MR signals) and image reconstruction for scout images, by controlling each component of the MRI apparatus 20.

More specifically, the object P is set on the table of the bed 32 and a static magnetic field is formed in the imaging space by the static magnetic field magnet 22 excited by the static magnetic field power supply 40. In addition, the electric current is supplied from the shim coil power supply 42 to the shim coil 24, thereby the static magnetic field formed in the imaging space is uniformed.

Then, when the MPU 86 receives the command of start of imaging from the input device 62, the MPU 86 inputs the imaging conditions including the pulse sequence to the sequence controller 56.

Then, the sequence controller 56 drives the gradient magnetic field power supply 44, the RF transmitter 46 and the RF receiver 48 according to the inputted pulse sequence, thereby gradient magnetic fields are formed in the imaging region including the imaging part of the object P, and RF pulses are generated from the RF coil 28.

At the time of the above generation of the gradient magnetic fields, the gradient magnetic field amplifier 128 switches between the first circuit operation state and the second circuit operation state according to the control voltage signals and so on, in the aforementioned manner. That is, the shortfall of electric power supplied from the direct-current power supply 124 as compared with power consumption of the gradient magnetic field coil 26 is supplemented by the electric power discharged from the electrolytic capacitor 126 according to an imaging sequence (the same applies to the main scan in Step S6).

Then, MR signals generated by nuclear magnetic resonance inside the object P are detected by the RF coil 28 and received by the RF receiver 48. The RF receiver 48 performs predetermined signal processing on the detected MR signals and then performs A/D conversion on the MR signals to generate the raw data, which are digitized complex number data of the MR signals. The RF receiver 48 inputs the generated raw data to the sequence controller 56.

The sequence controller 56 inputs the raw data to the image reconstruction unit 90.

The image reconstruction unit 90 arranges the raw data in the k-space formed in the k-space database 92 as k-space data.

In the above manner, data acquisition of scout images is performed.

The image reconstruction unit 90 obtains the k-space data from the k-space database 92 and reconstructs image data by performing image reconstruction processing including Fourier transformation on the obtained k-space data. The image reconstruction unit 90 stores the reconstructed image data in the image database 94.

The image processing unit 96 obtains the image data from the image database 94 and generates display image data for two-dimensional display by performing predetermined image processing on the obtained image data. The image processing unit 96 stores the display image data of the scout images in the storage device 66.

After this, the process proceeds to Step S4.

[Step S5] The display image data of the scout images are transmitted to the display control unit 98 under the command of the MPU 86, and they are displayed on the display device 64 as scout images.

Additionally, the display control unit 98 makes the display device 64 display a setting screen for setting the conditions of the imaging sequence of the main scan according to the command from the MPU 86. After this, the conditions of the imaging sequence of the main scan are selected by a user via the input device 62, and the MPU 86 sets the conditions of the imaging sequence of the main according to the selected conditions.

Note that, if the judgment result in Step S2 is affirmative and the process of Step S3 is performed, the upper limits and lower limits of the respective parameters in the setting screen for the conditions of the imaging sequence become the values (conditions) restricted in Step S3. Similarly, if the process of Step S3 is performed, the upper limits and lower limits of the respective parameters of the conditions of the imaging sequence automatically set by the MPU 86 become the values (conditions) restricted in Step S3. After this, the process proceeds to Step S6.

[Step S6] According to the conditions set in Step S5, the data acquisition of the main scan is performed in the way similar to that of the scout images. That is, the static magnetic field is formed in the imaging space, the gradient magnetic fields are formed in the imaging region, RF pulses are transmitted, and MR signals from the object P are acquired (collected). Then, the raw data are generated based on the acquired MR signals, and the raw data are arranged as k-space data in the k-space formed in the k-space database 92. After this, the process proceeds to Step S7.

[Step S7] The image reconstruction unit 90 reconstructs image data by performing image reconstruction processing on the above k-space data.

The image processing unit 96 generates display image data by performing predetermined image processing on the reconstructed image data. The image processing unit 96 stores the display image data in the storage device 66.

Then, the display image data are transmitted to the display control unit 98 under the command of the MPU 86, and the MPU 86 makes the display device 64 display the images obtained in the main scan.

The foregoing is a description of an operation of the MRI apparatus 20 according to the first embodiment.

In conventional technology, there is not an MRI apparatus that judges capacitance of a capacitor in its gradient magnetic field power supply. However, in the first embodiment, the value of the capacitance C of the electrolytic capacitor 126 is measured before imaging, and the conditions of the imaging sequence are restricted in terms of electric power if the capacitance C falls below the first threshold value $Cref1$.

That is, regardless of degradation degree of the capacitance C of the electrolytic capacitor 126, the upper limits and lower limits of the respective parameters of the imaging sequence are controlled (altered) so as to become within the range which makes the imaging sequence practicable and gives images of satisfactory image quality.

In other words, a user does not need to consider time degradation of the capacitance C of the electrolytic capacitor 126, as to setting of the conditions of the imaging sequence.

In conventional technology, if circuits of a gradient magnetic field power supply and condition setting programs for imaging sequences are designed based on the capacitance value of the electrolytic capacitor of initial installation time, problem-free MRI images can be obtained around the time of the initial installation, whereas there is a possibility that image quality degrades ten years later.

However, according to the first embodiment, such a problem in conventional technology is solved. Therefore, circuits of the gradient magnetic field power supply 44 can be designed without taking too much margin for capacitance degradation of the electrolytic capacitor 126 in the gradient magnetic field power supply 44.

Additionally, in the first embodiment, the thresholds of the capacitance of the electrolytic capacitor 126 consist of two phases. This is because a certain period of time is necessary for actually exchanging the electrolytic capacitor 126 after being recommended exchange of the electrolytic capacitor 126 by a caution display.

That is, the exchange recommendation display of the electrolytic capacitor 126 is displayed surely before the capacitance C of the electrolytic capacitor 126 degrades to the second threshold value $Cref2$. This is because the exchange recommendation display is performed when the capacitance C of the electrolytic capacitor 126 falls below the first threshold value $Cref1$ having a margin from the second threshold value $Cref2$. Thereby, a user can estimate the time of rough indication for exchanging the electrolytic capacitor 126 at a stage earlier than the stage when immediate exchange of the electrolytic capacitor 126 is desired. As a result, a user can make arrangement for exchanging the electrolytic capacitor 126 with sufficient spare time.

Moreover, in the first embodiment, the value of the capacitance C of the electrolytic capacitor 126 calculated based on measured values is recorded in the storage device 66 with its measurement date (in year-month-day format) and the clock time when the capacitance C is calculated.

Therefore, a maintenance service staff person can estimate the time of rough indication of exchanging the electrolytic capacitor 126, by checking the value of the capacitance C at the time of periodic inspection of the MRI apparatus 20. Thus, for example, by ordering a new (pristine) electrolytic capacitor 126 or a new (pristine) unit of the gradient magnetic field power supply 44 preliminarily, the electrolytic capacitor 126 can be rapidly exchanged when its capacitance falls below the second threshold value Cref2.

Although measurement of the capacitance C of the electrolytic capacitor 126 is started in synchronization with the timing of operation start of the MRI apparatus 20 by power activation in the above example, this is only an example. Hereinafter, as supplementary notes of the first embodiment, four modified embodiments for the timing of performing the judgment (measurement) of the capacitance C of the electrolytic capacitor 126 will be explained.

Firstly, measurement of the charging voltage Vbus (t) and so on may be started in synchronization with the start timing of reboot of the MRI apparatus 20 by reset operation, and the capacitance judging unit 102 may judge whether or not the value of the capacitance C falls below the first threshold value Cref1 and whether or not the value of the capacitance C falls below the second threshold value Cref2.

Secondly, during unoccupied hours of the MRI apparatus 20 in nocturnal period, the charging voltage Vbus(t) and so on may be measured, and the capacitance judging unit 102 may judge whether or not the value of the capacitance C falls below the first threshold valueCref1 and whether or not the value of the capacitance C falls below the second threshold value Cref2.

Thirdly, the charging voltage Vbus (t) and so on may be measured at the time of periodic inspection of the MRI apparatus 20, and the capacitance judging unit 102 may judge whether or not the value of the capacitance C falls below the first threshold value Cref1and whether or not the value of the capacitance C falls below the second threshold value Cref2.

In the above first to third cases, electric charge of the electrolytic capacitor 126 may be fully discharged, and the capacitance C may be measured at the time of charging from the fully discharged state. Note that, as to the methods of measuring the capacitance C at the time of charging the electrolytic capacitor 126, the first method and the second method explained by using the formulas (1) to (4) may be used.

Additionally, whether the value of the capacitance C falls below the threshold value or not may be judged at the time of charging the electrolytic capacitor 126 without calculating the value of the capacitance C, and this method is previously explained with FIG. 5.

In the case of the above reboot, it is preferable to discharge once in the aforementioned manner, because the electrolytic capacitor 126 has remanent charges. Discharge of the electrolytic capacitor 126 can be achieved by bringing the power source output current Ips(t) to zero state by de-actuating the direct-current power supply 124 and keeping the power source of the gradient magnetic field amplifier 128 on-state.

Thereby, electric charges in the electrolytic capacitor 126 flow into the gradient magnetic field amplifier 128 as the discharging current and are spontaneously consumed inside the gradient magnetic field amplifier 128, and this makes the electrolytic capacitor 126 fully discharge.

As to the measurement at the time of periodic inspection of the MRI apparatus 20, it is not limited to the above measurement at the time of charging, but the value of the capacitance C of the electrolytic capacitor 126 may be measured at the time of discharge by using the third method explained with the formula (5), for example.

In this case, for example, the electrolytic capacitor 126 may be fully charged so that the power source output current Ips (t) can be regarded as zero, then output of the direct-current power supply 124 is halted, and then the value of the capacitance C may be measured at the time of discharge of the electrolytic capacitor 126 from the fully charged state. An inspection button may be arranged for measurement at the time of periodic inspection, in such a manner that measurement of the value of the capacitance C of the electrolytic capacitor 126 and display of the measurement result on the display device 64 are performed if the button is pushed.

Fourthly, the value of the capacitance C may be measured, when the charging voltage Vbus(t) falls at the time of imaging, i.e. when the power consumption of the gradient magnetic field coil 26 is so much that it cannot be complemented only by the power source output current Ips(t) and the discharging current is supplied from the electrolytic capacitor 126.

In this case, all of the power source output current Ips(t) flows into the gradient magnetic field amplifier 128, and the charging current to the electrolytic capacitor 126 can be regarded as zero. Then, the discharge current Idis (t) can be calculated by subtracting the power source output current Ips(t) from the amplifier inflow current Iin(t). Then, the value of the capacitance C of the electrolytic capacitor 126 can be calculated by dividing the declination amount of the charging voltage Vbus(t) by time integral value of the discharge current Idis(t) (which is equal to the outflow electric charge Q from the electrolytic capacitor 126).

If the value of the capacitance C is judged below the first threshold value Cref1 in those first to fourth cases, the warning unit 100 performs the exchange recommendation display (see FIG. 6) and the condition restricting unit 104 restricts the conditions of the imaging sequence performed from the next time in terms of electric power.

Additionally, if the value of the capacitance C is judged below the second threshold value Cref2 in those first to fourth cases, the warning unit 100 performs the exchange recommendation display (see FIG. 7) and the condition restricting unit 104 restricts the conditions of the imaging sequence performed from the next time in terms of electric power more than the above case where the value of the capacitance C is judged below the first threshold value Cref1 (and above the second threshold Cref2). As to the contents of restriction of conditions of the imaging sequence, it is the same as the embodiment explained with FIG. 8.

According to the first embodiment and its modified embodiments described above, it is enabled in MRI to design circuits of a gradient magnetic field power supply without taking too much margin for capacitance degradation of a charge/discharge element for supplying power in the gradient magnetic field power supply.

(Second Embodiment)

Hereinafter, the second embodiment will be explained.

The MRI apparatus 20 of the second embodiment is the same as that of the first embodiment except that a voltage detector 142 is added inside the gradient magnetic field power supply 44 and the method of calculating the capacitance C of the electrolytic capacitor 126 is different from the first embodiment. Thus, the second embodiment will be explained by focusing on the difference between the first and second embodiments.

Figure 9:
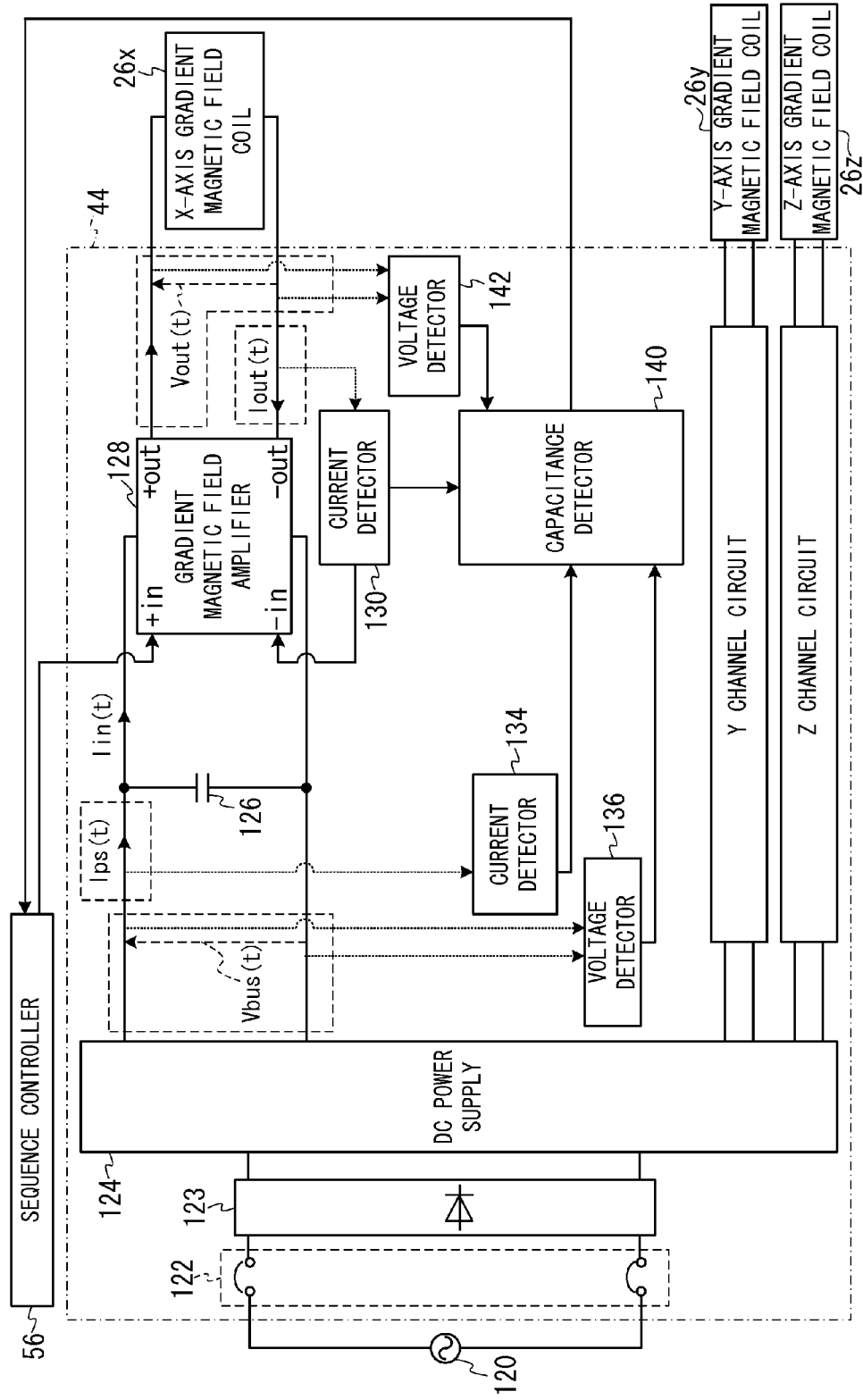
FIG. 9 is a block diagram showing an example of a configuration of a gradient magnetic field power supply in the second embodiment.

FIG. 9 is a block diagram showing an example of a configuration of the gradient magnetic field power supply in the second embodiment. In order to avoid complication, minute circuit structure is shown only for the X channel part which supplies electric power to the X axis gradient magnetic field coil 26x in FIG. 9.

The second embodiment is different from the first embodiment in that (A) "the voltage detector 142 which detects the output voltage Vout(t) of the gradient magnetic field amplifier 128 and inputs it to the capacitance detector 140" is added and (B) the current detector 132 is omitted.

The output voltage Vout(t) is the voltage applied to the X axis gradient magnetic field coil 26x. Configuration and function of the Y channel circuit and the Z channel circuit whose minute structures are omitted in FIG. 9 are the same as the above X channel.

Here, if the electric load of the X axis gradient magnetic field coil 26x is approximated by a series circuit consisting of a resistance whose ohmic value is Rload and a coil whose inductance value is Lload, the output voltage Vout(t) is given by the following formula (7).

$$Vout(t) = R_{load} \cdot Iout(t) + L_{load} \cdot \frac{d\,Iout(t)}{dt} \quad (7)$$

Figure 10:
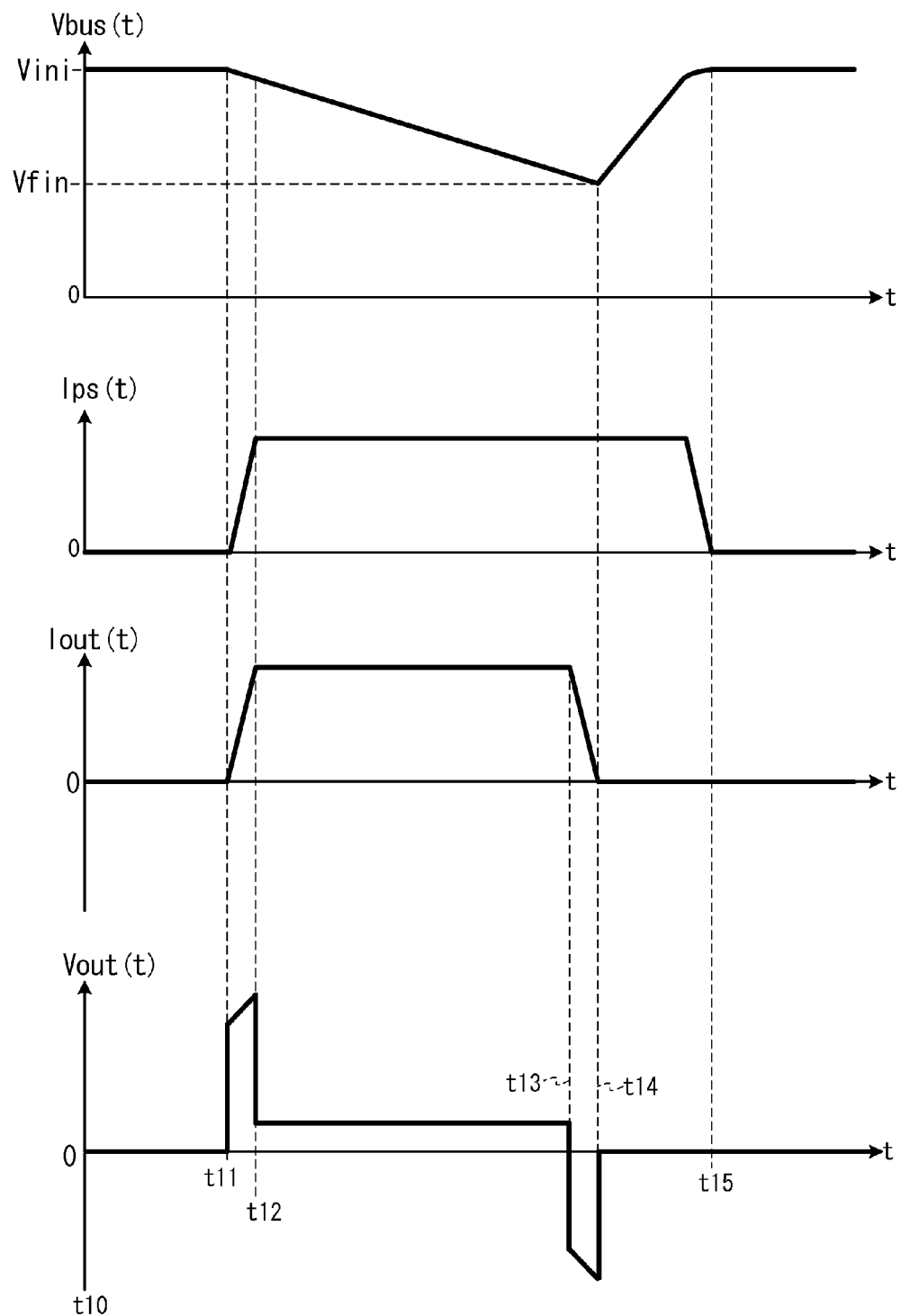
FIG. 10 is a schematic diagram showing an example of the waveform of the output voltage of an X channel gradient magnetic field amplifier electric current waveform and voltage waveform for each component that are simplified on the assumption that they comply with the formula (7)

FIG. 10 is a schematic diagram showing an example of "the waveform of the output voltage Vout(t) of the X channel gradient magnetic field amplifier 128", "electric current waveform and voltage waveform for each component" that are simplified on the assumption that they comply with the formula (7). In FIG. 10, the respective vertical axes indicate the output voltage of the direct-current power supply 124 (the charging voltage of the electrolytic capacitor 126) Vbus(t), the power source output current Ips(t) of the direct-current power supply 124, the output current Iout(t) of the gradient magnetic field amplifier 128 and the output voltage Vout (t) of the gradient magnetic field amplifier 128, from top to bottom. Each abscissa axis indicates elapsed time t. Hereinafter, the circuit operation will be explained.

After power activation of the gradient magnetic field power supply 44, the electrolytic capacitor 126 is immediately charged up to the fully charged voltage.

Thus, if the start time of the imaging sequence is defined as time t10, at least during the period between time t10 and time t11, the output voltage Vbus(t) of the direct-current power supply 124 is constant at Vini and the output current Ips(t) of the direct-current power supply 124 is constant because it consists of only standby current.

After that, at time t11, the control voltage signal from the sequence controller 56 into the positive-side input terminal (+in) of the gradient magnetic field amplifier 128 begins to increase with a constant gradient. As described earlier, because the gradient magnetic field amplifier 128 outputs the output current Iout(t) which is proportional to the voltage inputted to the positive-side input terminal (+in), the temporal waveform of Iout(t) in FIG. 10 is similar to the above control voltage signal.

The temporal differentiation of the second term of the left-hand member of the formula (7) is zero before time t11, and becomes a positive constant value while Iout(t) increases with a constant gradient after time t11.

Thus, at time t11, the output voltage Vout(t) of the gradient magnetic field amplifier 128 instantaneously rises by the amount corresponding to the second term of the left-hand member of the formula (7).

On the other hand, though the first term (R×Iout(t)) of the left-hand member of the formula (7) is zero, the first term (R×Iout(t)) of the left-hand member of the formula (7) rises after time t11 in accordance with the increase of Iout(t) and the output voltage Vout(t) rises.

Additionally, because supply of the output current Iout(t) from the gradient magnetic field amplifier 128 starts after time t11, as its current supply source, the direct-current power supply 124 supplies the gradient magnetic field amplifier 128 with electric current. Thus, the output current Ips(t) of the direct-current power supply 124 rises at time t11, and then it becomes a constant value.

As an example here, it is assumed that the sum of the power consumption Pampx(t) of the gradient magnetic field amplifier 128 of the X channel and the power consumption Pxcoil(t) of the X axis gradient magnetic field coil 26xis larger than the rated output power for the X channel of the direct-current power supply 124.

In this case, during the period from time t11 to time t14, the gradient magnetic field amplifier 128 switches the gradient magnetic field power supply 44 into the aforementioned second circuit operation state. Therefore, the shortfall of electric power supplied from the direct-current power supply 124 as compared with power consumption of the gradient magnetic field coil 26 is supplemented by the electric power discharged from the electrolytic capacitor 126.

Thus, after time t11, in addition to the power supply from the direct-current power supply 124 to the gradient magnetic field amplifier 128, the electrolytic capacitor 126 supplies the gradient magnetic field amplifier 128 with electric power as the discharging current, and the charging voltage Vbus(t) decreases.

At time t12, because the output current Iout(t) switches from the state of rising with a constant gradient to a constant value, and its temporal differentiation switches to zero and the second term of the left-hand member of the formula (7) becomes zero.

Thus, the output voltage Vout(t) instantaneously falls at time t12 and keeps a constant value until time t13 until which the output current Iout (t) keeps a constant value.

At time t13, the output current Iout(t) having kept a constant value begins to decrease with a constant gradient. Thereby, the temporal differentiation of the output current Iout (t) in the second term of the left-hand member of the formula (7) switches from zero to a negative constant value, and the output current Iout(t) instantaneously falls at time t13. On the other hand, because the first term of the left-hand member of the formula (7) decreases in accordance with the decrease of Iout(t) after time t13, the output voltage Vout(t) falls after time t13.

At time t14, the supply of the output current Iout (t) stops and the charging voltage Vbus(t) switches from the state of decreasing to the state of increasing. This is because supply current for the gradient magnetic field amplifier 128 becomes unnecessary after time t14 and thereby the electrolytic capacitor 126 is charged by the output current Ips(t) of the direct-current power supply 124. Therefore, at time t14 which is the timing before charging, the charging voltage Vbus(t) becomes the local minimal value and this local minimal value is defined as Vfin.

The output current Ips(t) of the direct-current power supply 124 begins to fall when the electrolytic capacitor 126 gets close to the fully charged state. When charging of the electrolytic capacitor 126 is completed at time t15, the output current Ips(t) of the direct-current power supply 124 becomes the standby current.

The foregoing is the explanation of the circuit operation.

Hereinafter, a method of calculating the value of the capacitance C of the electrolytic capacitor 126 in the second embodiment will be explained.

In the second embodiment, the value of the capacitance C of the electrolytic capacitor 126 is calculated in terms of energy balance during implementation term of the imaging sequence requiring a large amount of power consumption.

The above requiring a large amount of power consumption means a case where the power consumption of the gradient magnetic field coil 2 is so large that it cannot be provided (compensated) only by the power source output current Ips(t) and the electrolytic capacitor 126 supplies the gradient magnetic field amplifier 128 with electric power as the discharging current.

The charging energy to the electrolytic capacitor 126 is defined as Ein, the discharging energy from the electrolytic capacitor 126 is defined as Eout, the charging voltage of the electrolytic capacitor 12 at the start timing (time t11) of discharging is defined as Vini (see FIG. 10), and the charging voltage of the electrolytic capacitor 126 at the completion timing (time t14) of discharging is defined as Vfin (see FIG. 10). Then, the following formula (8) is obtained.

$$|Ein - Eout| = \left|\frac{1}{2} \cdot C \cdot (Vfin^2 - Vini^2)\right| \quad (8)$$

The charging energy Ein can be calculated by performing temporal integration on the product of the power source output current Ips(t) measured by the current detector 134 and the charging voltage (output voltage of the direct-current power supply 124) Vbus(t) measured by the voltage detector 136.

$$Ein = \int Ips(t) \cdot Vbus(t) dt \quad (9)$$

The discharging energy Eout can be calculates as a function of the output current Iout(t) outputted from the gradient magnetic field amplifier 128 and returned via the gradient magnetic field coil 26x. That is, most of the power consumed by the gradient magnetic field amplifier 128 is consumed by the switching element, and thus the power consumption Pampx(t) of the gradient magnetic field amplifier 128 can generally be expressed by the following approximate formula.

$$Pampx(t) = Wa \times \{Iout(t)\}^2 + Wb \times Iout(t) + Wc \quad (10)$$

In the formula (10), each of Wa, Wb and Wc is a constant determined by the characteristics of the switching element, and preliminarily measured and stored in the capacitance detector 140. Alternatively, theoretical values of the constants Wa, Wb and Wc may be preliminarily calculated by simulation and stored in the capacitance detector 140.

Additionally, the power consumption Pxcoil(t) of the X axis gradient magnetic field coil 26x can be calculated by the following formula (11).

$$Pxcoil(t) = Iout(t) \times Vout(t) \quad (11)$$

Note that, instead of the formula (11), the power consumption Pxcoil(t) of the X axis gradient magnetic field coil 26x may be calculated by the product of an instantaneous value Iout of the output current Iout(t) of the gradient magnetic field amplifier 128 and an instantaneous value Vout of the output voltage Vout(t). The above instantaneous value Iout of the output current Iout(t) may be calculated by the control current value of the gradient magnetic field amplifier 128 or the current value measured by the current detector 130.

Next, the discharging energy can be calculated by performing temporal integration on the sum of the power consumption Pxcoil(t) of the X axis gradient magnetic field coil 26x and the power consumption Pampx(t) of the gradient magnetic field amplifier 128, like the following formula (12).

$$Eout = \int \{Pampx(t) + Pxcoil(t)\} dt \quad (12)$$

Here, because the charging voltages Vini of the electrolytic capacitor 126 at the start timing of discharging and the charging voltages Vfin of the electrolytic capacitor 126 at the completion timing of discharging are measured by the voltage detector 136, these measured values are substituted for the formula (8). Moreover, the charging energy Ein and the discharging energy Eout calculated in the above manner are substituted for the formula (8), and then the value of the capacitance C of the electrolytic capacitor 126 can be calculated by the formula (8).

As to the capacitance value of the electrolytic capacitor of the Y channel and the capacitance value of the electrolytic capacitor of the Z channel, they can be calculated in the way similar to the above manner for the X channel.

A case where the above calculation method is practicable is a case where the power consumption of the power source output current Ips(t) is so large that it cannot be provided (compensated) only by the power source output current Ips(t), as described previously. For example, if measurement of the charging voltage Vbus(t) of the electrolytic capacitor 126 and so on is started at the same time as start of a prescan and the charging voltage Vbus (t) is low, the capacitance C may be calculated during the implementation term of this prescan.

As an example of a prescan having possibilities of increasing power consumption to such a degree that the discharging current is supplied from the electrolytic capacitor 126, there is a template shot for obtaining phase correction data of EPI. EPI means Echo Planar Imaging.

More specifically, for example, according to Japanese Patent Application Laid-open (KOKAI) Publication No. 09-276243, two template shots A and B in which the polarities of the gradient magnetic fields in the readout direction are opposite are performed to acquire echo data (MR signals) before a main scan. The pair of echo data acquired by the template shots A and B are the same in echo time and therefore in phase error caused by the non-uniformity of the static magnetic field. Based on this, the phase error component caused by the non-uniformity of the static magnetic field is removed. In this way, the phase error component due to the causes other than the non-uniformity of the static magnetic field is selectively extracted and used as phase correction data.

Note that, a scan is an operation of acquiring MR signals, and it does not include image reconstruction processing. The aforementioned prescan is, for example, a scan for calibration which is performed before the main scan in order to determine unconfirmed conditions of imaging sequence of the main scan, conditions and data used for image reconstruction processing after the main scan and so on. The aforementioned main scan is a scan for imaging an intended diagnosis image such as a T1 weighted image, and it does not include a scan for acquiring MR signals for a scout image or a calibration scan such as a prescan.

Figure 11:
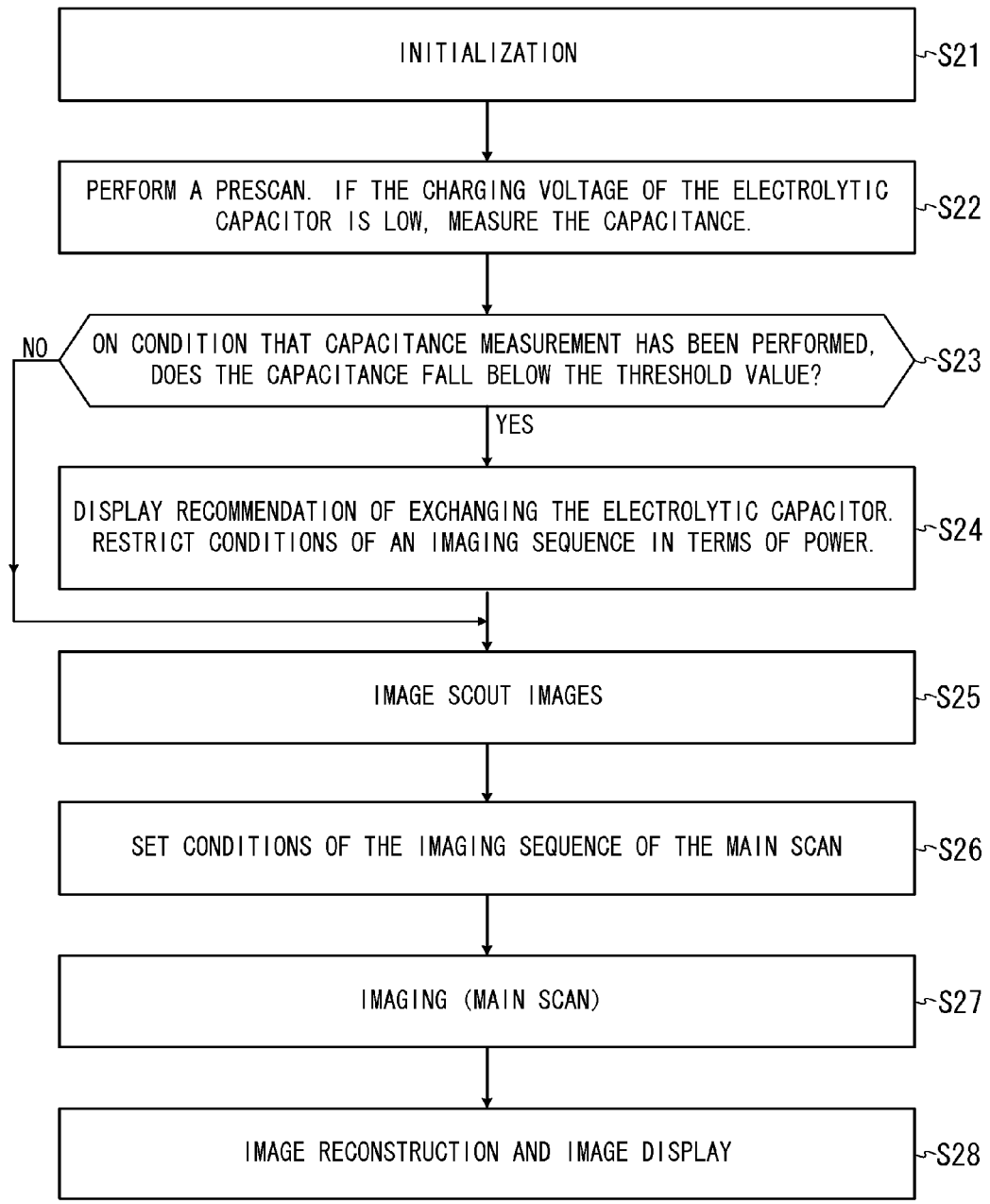
FIG. 11 is a flowchart illustrating an example of a flow performed by the MRI apparatus of the second embodiment.

FIG. 11 is a flowchart illustrating an example of a flow of a process performed by the MRI apparatus 20 of the second embodiment. In the following, according to the step numbers in the flowchart shown in FIG. 11, an operation of the MRI apparatus 20 of the second embodiment will be described.

[Step S21] The power activation of the MRI apparatus 20 is performed, and the electrolytic capacitor 126 is fully charged by the power source output current Ips(t) from the direct-current power supply 124. Additionally, the MPU 86 performs initial setting of the MRI apparatus 20. After this, the process proceeds to Step S22.

[Step S22] The MPU 86 makes the MRI apparatus 20 perform prescans by controlling each component thereof. The prescans here includes a prescan in which a large amount of electric power is consumed such as the aforementioned template shot for obtaining phase correction data of EPI, for example.

In synchronization with start of the prescan, the current detectors 130 and 134 and the voltage detectors 136 and 142 respectively begin to measure time variation of the output current Iout(t), time variation of the power source output current Ips(t), time variation of the charging voltage Vbus(t) and time variation of the output voltage Vout(t) of the gradient magnetic field amplifier 128, and respectively input the measured values into the capacitance detector 140.

The capacitance detector 140 monitors time variation of the charging voltage Vbus(t). The capacitance detector 140 calculates the value of the capacitance C of the electrolytic capacitor 126 by the method explained with the formulas (8) to (12), if the charging voltage Vbus(t) continues to fall for a predetermined period. The above predetermined period means a period long enough to be able to calculate the value of the capacitance C of the electrolytic capacitor 126 accurately, i.e. the declination amount of the charging voltage Vbus(t) during the predetermined period is long enough to be able to calculate the value of the capacitance C accurately.

When the capacitance detector 140 calculates the value of the capacitance C of the electrolytic capacitor 126, the capacitance detector 140 inputs the value of the calculated capacitance C to the capacitance judging unit 102 via the sequence controller 56. The capacitance judging unit 102 stores the value of the capacitance C as well as its measured date (in year-month-day format) in the storage device 66.

After this, the process proceeds to Step S23.

[Step S23] If the capacitance C is not calculated in a prescan in Step S22, the MPU 86 makes the process of the MRI apparatus 20 proceed to Step S25.

On the other hand, if the value of the capacitance C is calculated, the capacitance judging unit 102 judges whether the value of the capacitance C falls below the first threshold value Cref1 or not and whether the value of the capacitance C falls below the second threshold value Cref2 or not, and inputs the judgment results and the value of the capacitance C to the warning unit 100 and the condition restricting unit 104 respectively.

If the value of the capacitance C is calculated and the capacitance C falls below the first threshold value Cref1 in at least one of the X, Y and Z channels, the process proceeds to Step S24. If this is not the case, the process proceeds to Step S25.

[Steps S24 to S28] Each of the processes of Steps S24 to S28 is the same as the processes of Steps S3 to S7 in FIG. 8 of the first embodiment and overlapping explanation is abbreviated. The foregoing is the explanation of the flow of FIG. 11.

As just described, the same effects as the first embodiment can be obtained in the second embodiment.

Although the value of the capacitance C of the electrolytic capacitor 126 is measured in the above example when the charging voltage Vbus(t) of the electrolytic capacitor 126 is decreasing during implementation term of a prescan, this is only an example. Hereinafter, as supplementary notes of the second embodiment, two modified embodiments for the timing of judging (measuring) the capacitance C of the electrolytic capacitor 126 will be explained.

Firstly, acquisition of MR signals of the scout images may be performed by a pulse sequence whose power consumption is large such as EPI so as to measure the value of the capacitance C of the electrolytic capacitor 126 during the acquisition of MR signals, and the exchange recommendation display and the restriction of the conditions of the imaging sequence in terms of electric power may be performed according to the degradation degree of the measured capacitance C.

Secondly, the value of the capacitance C of the electrolytic capacitor 126 may be measured during implementation term of the main scan. In this case, if the capacitance C of the electrolytic capacitor 126 is less than the first threshold Cref1, the warning unit 100 performs the exchange recommendation display on the display device 64 after completion of the main scan and the condition restricting unit 104 restricts the conditions of the imaging sequence from the next time.

(Supplementary Notes of Embodiments)

Hereinafter, supplementary note common to the first embodiment and the second embodiment will be explained.

Instead of the electrolytic capacitor 126, a charge/discharge element such as a secondary battery or an electric double layer capacitor may be alternatively used. The charge/discharge element herein refers to a circuit element that can be repeatedly charged and discharged, such as a capacitor, a secondary battery and so on.

Although the thresholds as index of rough indication of exchange of the electrolytic capacitor 126 consist of two phases (Cref1 and Cref2) in the above example, the threshold(s) may be only one or three or more than three.

Although an example in which the value of the capacitance C of the electrolytic capacitor 126 is calculated by measuring the charging voltage Vbus(t) of the electrolytic capacitor 126 and so on has been described, this is only an example of calculation methods of the value of the capacitance C. For example, in the first embodiment and the second embodiment, the value of the capacitance C of the electrolytic capacitor 126 may be calculated by measuring charge and discharge current to one (unilateral) electrode of the electrolytic capacitor 126 and so on, without measuring the charging voltage Vbus(t). Note that, the above charge and discharge current is a charging current at the time of charging, and its sign reverses as discharging current at the time of discharging. Alternatively, the value of the capacitance C of the electrolytic capacitor 126 may be calculated by measuring both the charging voltage Vbus(t) and the above charge and discharge current.

An example has been described in which (as the MRI apparatus 20) the RF receiver 48 is disposed outside the gantry that includes the static magnetic field magnet 22, the shim coil 24, the gradient magnetic field coil unit 26, the RF coils 28 and the like (see FIG. 1). However, the embodiment of the present invention is not limited to such an implementation. The RF receiver 48 may be included in the gantry.

Specifically, for example, an electronic circuit board that is equivalent to the RF receiver 48 may be disposed in the gantry. Then, the MR signals, which are analog electrical signals converted from the electromagnetic wave by the receiving RF coil, may be amplified by a pre-amplifier in the electronic circuit board, the amplified signals may be outputted to the outside of the gantry as digital signals and inputted to the sequence controller 56. In outputting the signals to the outside of the gantry, for example, an optical communication cable is preferably used to transmit the signals in the form of optical digital signals. This is because the effect of external noise is reduced.

Correspondences between terms used in the claims and terms used in the embodiment described above will be described. Note that the correspondences described below are just some of possible interpretations for reference and should not be construed as limiting the present invention.

The sequence controller 56 which inputs the control voltage signals to the gradient magnetic field amplifier 128 and the gradient magnetic field amplifier 128 which controls charging and discharging of the electrolyte capacitor 126 is an example of the charge/discharge controlling unit described in the claims.

The structure of the entirety of the current detectors 132 and 134, the voltage detectors 136 and 142, the capacitance detector 140 and the capacitance judging unit 102 that measures the charging voltage Vbus (t) of the electrolyte capacitor 126 and so on and judges whether the value of the capacitance C of the electrolyte capacitor 126 falls below the threshold value or not is an example of the judging unit described in the claims.

The gradient magnetic field amplifier 128 which switches between the aforementioned first circuit operation state and the second circuit operation state according to the control voltage signals corresponding to the power consumption of the gradient magnetic field coil 26 inputted from the sequence controller 56 is an example of the switching control unit described in the claims.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A magnetic resonance imaging apparatus performing magnetic resonance imaging, with application of a gradient magnetic field to an imaging region by supplying a gradient magnetic field coil with electric power according to an imaging sequence, comprising:
    a charge/discharge controlling unit configured to include a charge/discharge element, receive electric power, charge the charge/discharge element by using received electric power, and supply the gradient magnetic field coil with electric power discharged from the charge/discharge element at a time of performance of the magnetic resonance imaging;
    a judging unit configured to judge whether capacitance of the charge/discharge element falls below a threshold value or not; and
    a condition restricting unit configured to restrict an electric power amount supplied to the gradient magnetic field coil by restricting conditions of the imaging sequence, when the judging unit judges that the capacitance of the charge/discharge element falls below the threshold value.

2. The magnetic resonance imaging apparatus according to claim 1, further comprising a direct-current power supply configured to supply the gradient magnetic field coil with direct-current power,
    wherein the charge/discharge controlling unit is configured to supplement shortfall of electric power supplied from the direct-current power supply as compared with power consumption of the gradient magnetic field coil, by using electric power discharged from the charge/discharge element according to the imaging sequence.

3. The magnetic resonance imaging apparatus according to claim 2, further comprising:
    a display device; and
    a warning unit configured to make the display device perform exchange recommendation display of the charge/discharge element, when the judging unit judges that the capacitance of the charge/discharge element falls below the threshold value.

4. The magnetic resonance imaging apparatus according to claim 3, further comprising a storage device,
    wherein the judging unit is configured to calculate a capacitance value of the charge/discharge element based on at least one of charging voltage of the charge/discharge element and charge and discharge current of the charge/discharge element, and store the capacitance value calculated and measurement date in the storage device.

5. The magnetic resonance imaging apparatus according to claim 4,
    wherein the judging unit is configured to judge whether or not the capacitance of the charge/discharge element falls below a first threshold value and whether or not the capacitance of the charge/discharge element falls below a second threshold value which is smaller than the first threshold value; and
    when the capacitance of the charge/discharge element falls below the second threshold, the condition restricting unit restricts electric power supplied to the gradient magnetic field coil more than a case where the capacitance of the charge/discharge element does not fall below the second threshold value but falls below the first threshold value.

6. The magnetic resonance imaging apparatus according to claim 5,
    wherein the judging unit is configured to start measuring at least one of charging voltage of the charge/discharge element and charge and discharge current of the charge/discharge element in synchronization with start-up of the magnetic resonance imaging apparatus by power activation.

7. The magnetic resonance imaging apparatus according to claim 5,
    wherein the judging unit is configured to start measuring at least one of charging voltage of the charge/discharge element and charge and discharge current of the charge/discharge element in synchronization with reboot of the magnetic resonance imaging apparatus.

8. The magnetic resonance imaging apparatus according to claim 1,
    wherein the judging unit is configured to measure at least one of charging voltage of the charge/discharge element and charge and discharge current of the charge/discharge element during implementation term of a prescan, and then judge whether the capacitance of the charge/discharge element falls below the threshold value or not.

9. The magnetic resonance imaging apparatus according to claim 1,
    wherein the judging unit is configured to start measuring at least one of charging voltage of the charge/discharge element and charge and discharge current of the charge/ discharge element in synchronization with start-up of the magnetic resonance imaging apparatus by power activation.

10. The magnetic resonance imaging apparatus according to claim 1,
wherein the judging unit is configured to start measuring at least one of charging voltage of the charge/discharge element and charge and discharge current of the charge/discharge element in synchronization with reboot of the magnetic resonance imaging apparatus.

11. The magnetic resonance imaging apparatus according to claim 1,
wherein the judging unit is configured to measure at least one of charging voltage of the charge/discharge element and charge and discharge current of the charge/discharge element during implementation term of a prescan, and then judge whether the capacitance of the charge/discharge element falls below the threshold value or not.

12. The magnetic resonance imaging apparatus according to claim 1,
wherein the judging unit is configured to judge whether or not the capacitance of the charge/discharge element falls below a first threshold value and whether or not the capacitance of the charge/discharge element falls below a second threshold value which is smaller than the first threshold value; and
when the capacitance of the charge/discharge element falls below the second threshold, the condition restricting unit restricts electric power supplied to the gradient magnetic field coil more than a case where the capacitance of the charge/discharge element does not fall below the second threshold value but falls below the first threshold value.

13. The magnetic resonance imaging apparatus according to claim 1, further comprising:
a display device; and
a warning unit configured to make the display device perform exchange recommendation display of the charge/discharge element, when the judging unit judges that the capacitance of the charge/discharge element falls below the threshold value.

14. The magnetic resonance imaging apparatus according to claim 1, further comprising a storage device,
wherein the judging unit is configured to calculate a capacitance value of the charge/discharge element based on at least one of charging voltage of the charge/discharge element and charge and discharge current of the charge/discharge element, and store the capacitance value calculated and measurement date in the storage device.

15. The magnetic resonance imaging apparatus according to claim 1, further comprising:
a direct-current power supply configured to supply the gradient magnetic field coil with direct-current power; and
a switching control unit configured to switch between a first circuit operation state in which the gradient magnetic field coil is supplied with electric power from the direct-current power supply without consuming accumulated electric power of the charge/discharge element and a second circuit operation state in which the gradient magnetic field coil is supplied with electric power from the direct-current power supply and the charge/discharge element, according to power consumption of the gradient magnetic field coil.

16. The magnetic resonance imaging apparatus according to claim 15, further comprising:
a display device; and
a warning unit configured to make the display device perform exchange recommendation display of the charge/discharge element, when the judging unit judges that the capacitance of the charge/discharge element falls below the threshold value.

17. The magnetic resonance imaging apparatus according to claim 16, further comprising a storage device,
wherein the judging unit is configured to calculate a capacitance value of the charge/discharge element based on at least one of charging voltage of the charge/discharge element and charge and discharge current of the charge/discharge element, and store the capacitance value calculated and measurement date in the storage device.

18. The magnetic resonance imaging apparatus according to claim 17,
wherein the judging unit is configured to start measuring at least one of charging voltage of the charge/discharge element and charge and discharge current of the charge/discharge element in synchronization with start-up of the magnetic resonance imaging apparatus by power activation or reboot of the magnetic resonance imaging apparatus.

19. A magnetic resonance imaging method applying a gradient magnetic field to an imaging region by supplying a gradient magnetic field coil with electric power according to an imaging sequence, acquiring MR signals from the imaging region with the application of the gradient magnetic field, and reconstructing imaging data based on the MR signals, the magnetic resonance imaging method comprising the steps of:
judging whether or not capacitance of a charge/discharge element supplying the gradient magnetic field coil with electric power as discharge current falls below a threshold value; and
restricting electric power amount supplied to the gradient magnetic field coil by restricting conditions of the imaging sequence, when the capacitance of the charge/discharge element falls below the threshold value.

* * * * *